(12) United States Patent
Ishimura et al.

(10) Patent No.: US 7,610,533 B2
(45) Date of Patent: Oct. 27, 2009

(54) SEMICONDUCTOR INTEGRATED CIRCUIT AND METHOD FOR TESTING THE SAME

(75) Inventors: Takashi Ishimura, Osaka (JP); Sadami Takeoka, Osaka (JP)

(73) Assignee: Panasonic Corporation, Osaka (JP)

( * ) Notice: Subject to any disclaimer, the term of this patent is extended or adjusted under 35 U.S.C. 154(b) by 278 days.

(21) Appl. No.: 11/266,406

(22) Filed: Nov. 4, 2005

(65) Prior Publication Data
US 2006/0174176 A1    Aug. 3, 2006

(30) Foreign Application Priority Data
Jan. 31, 2005    (JP) .............................. 2005-024149

(51) Int. Cl.
*G01R 31/28*    (2006.01)
*G06F 11/00*    (2006.01)
*G06F 1/26*    (2006.01)
*G06F 1/00*    (2006.01)

(52) U.S. Cl. .................. 714/726; 714/729; 714/30; 713/320; 713/324; 713/340

(58) Field of Classification Search ................ 714/726, 714/729, 30; 713/320, 324, 340
See application file for complete search history.

(56) References Cited

U.S. PATENT DOCUMENTS

| | | | | |
|---|---|---|---|---|
| 5,311,081 | A * | 5/1994 | Donaldson et al. ............. 326/62 |
| 5,941,990 | A * | 8/1999 | Hiiragizawa ................. 713/310 |
| 6,208,170 | B1 * | 3/2001 | Iwaki et al. ................. 326/121 |
| 6,225,858 | B1 * | 5/2001 | Guardiani et al. ............ 327/544 |
| 6,433,584 | B1 * | 8/2002 | Hatae ........................... 326/80 |
| 6,609,209 | B1 * | 8/2003 | Tiwari et al. ................. 713/322 |
| 6,753,702 | B2 | 6/2004 | Mizuno et al. |
| 7,102,382 | B2 * | 9/2006 | Drenth et al. ................. 326/38 |
| 7,124,339 | B2 | 10/2006 | Sumita et al. |

(Continued)

FOREIGN PATENT DOCUMENTS

GB    0284276 A2 *    9/1988

(Continued)

OTHER PUBLICATIONS

English Translation of JP2002350505 (A) from JPO website. JP2002350505 (A) to Hitachi is listed in IDS filed Mar. 26, 2009.*

(Continued)

*Primary Examiner*—John J Tabone, Jr.
(74) *Attorney, Agent, or Firm*—McDermott Will & Emery LLP

(57) ABSTRACT

In a semiconductor integrated circuit, power source wiring for supplying power supply voltage to a plurality of flip flop circuits, and power source wiring for supplying different power supply voltage to a combinational circuit are provided individually, so that the power supply to the flip flop circuits and the power supply to the combinational circuit can be performed separately from, and independently of, each other. During shift operation in scan testing, the power supply voltage to the combinational circuit is set to a low voltage or cut off, thereby suppressing the amount of power consumed by the combinational circuit portion during the shift operation. At the same time, the power supply voltage to the flip flop circuits is set to a high voltage during the shift operation.

23 Claims, 30 Drawing Sheets

U.S. PATENT DOCUMENTS

2004/0004888 A1    1/2004    Sumita et al.
2006/1023231    10/2006    Nomura

FOREIGN PATENT DOCUMENTS

| | | |
|---|---|---|
| JP | 05-206420 | 8/1993 |
| JP | 2001-015692 A | 1/2001 |
| JP | 2001-059856 A | 3/2001 |
| JP | 2002-350505 A | 12/2002 |
| JP | 2003-098223 A | 4/2003 |
| JP | 2003-152082 A | 5/2003 |
| JP | 2003-315413 A | 11/2003 |
| JP | 2004-055872 A | 2/2004 |
| WO | WO 20051008777 A1 | 1/2005 |

OTHER PUBLICATIONS

Japanese Notice of Reasons for Rejection, w/ English translation thereof, issued in Japanese Patent Application No. JP 2005-024149 dated Mar. 10, 2009.

* cited by examiner

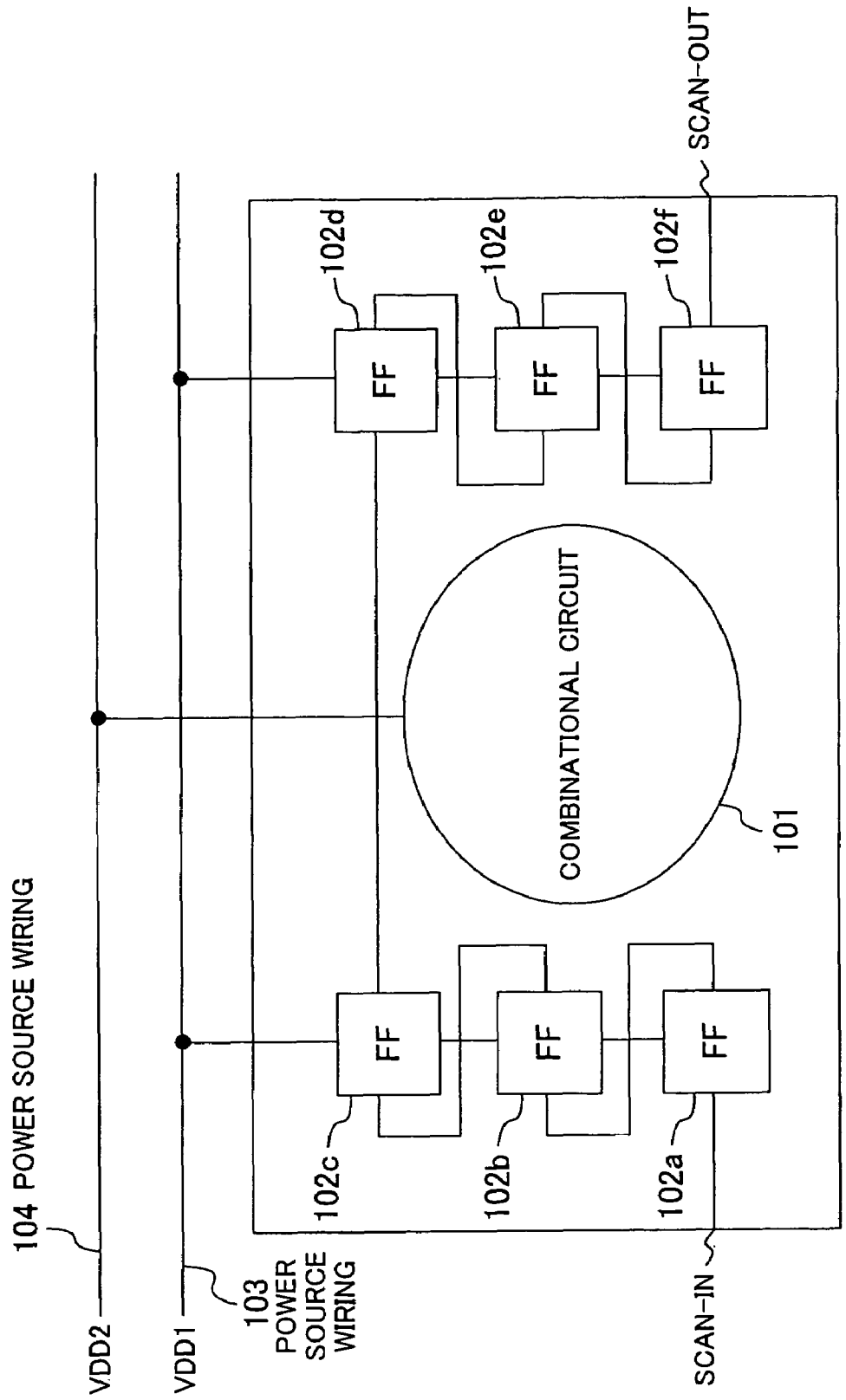

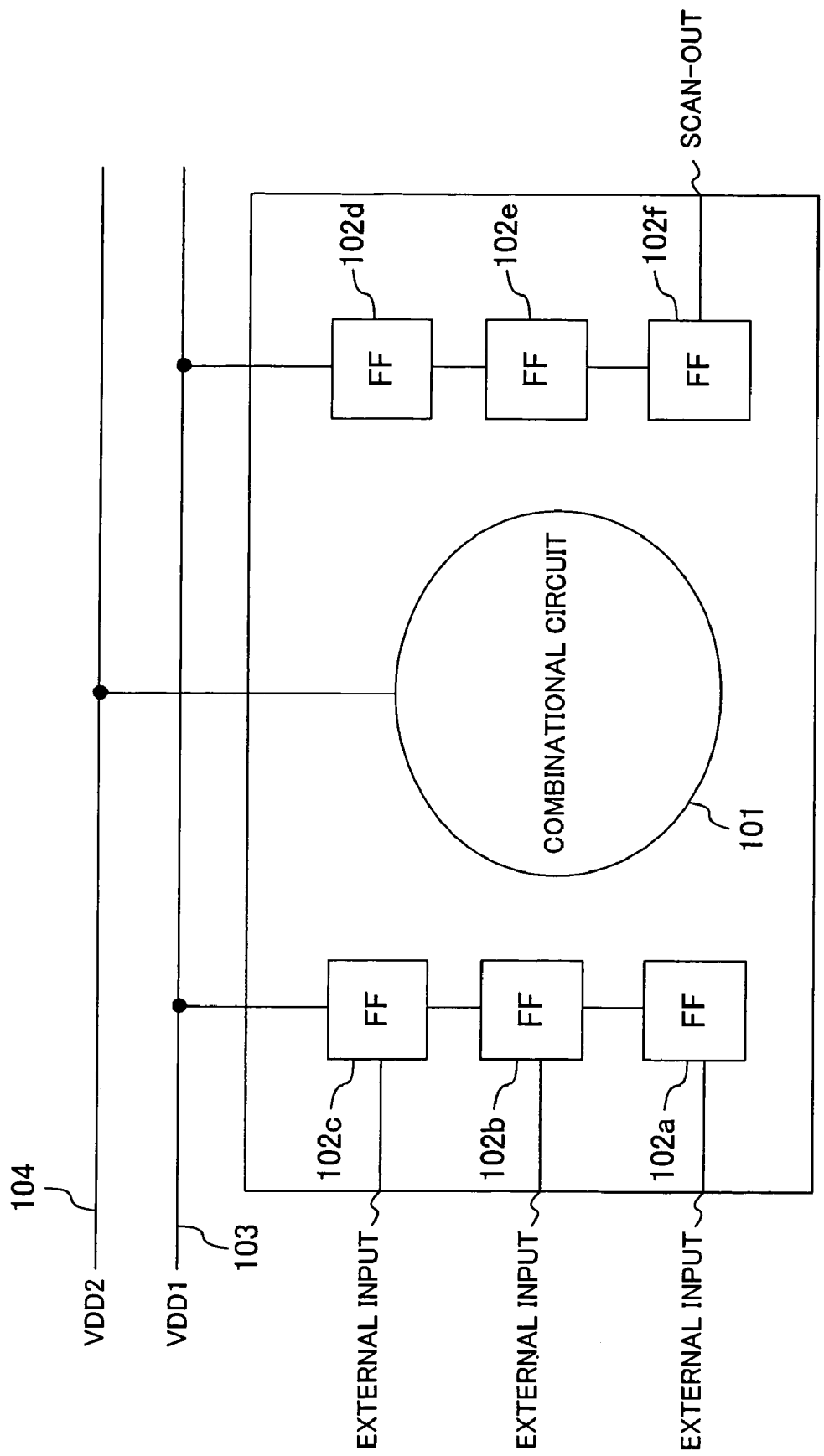

SEMICONDUCTOR INTEGRATED CIRCUIT AND METHOD FOR TESTING THE SAME

CROSS-REFERENCES TO RELATED APPLICATIONS

This Non-provisional application claims priority under 35 U.S.C. §119(a) on Patent Application No. 2005-24149 filed in Japan on Jan. 31, 2005, the entire contents of which are hereby incorporated by reference.

BACKGROUND OF THE INVENTION

The present invention relates to semiconductor integrated circuits and methods for testing the same.

In recent years, progress in technology for microscaling semiconductor fabrication processes has continued without a letup, and the semiconductor technology has consequently moved into the era of the 90 nm and 65 nm generations. This progress has enabled a complex system conventionally composed of a plurality of LSIs to be integrated on a single silicon chip and realized as a system-on-a-chip. Since transistor integration per unit area and operating frequency have been increased rapidly, a plurality of IP cores having different functions and features can be incorporated into a single chip, thereby realizing a complex high-speed system-on-a-chip.

However, as the number of devices in a semiconductor circuit has increased, the amount of time required to test the circuit has increased. Also, the incorporation of cores having different features requires various types of tests to be performed. As a result, the test cost has been increasing. In addition, since current semiconductor circuits provide high-performance and high-speed operation, it has become difficult to assure high-quality test. Under these situations, system-on-a-chip venders have been studying semiconductor design technology and test techniques for realizing high-quality and low-cost test.

Popular methods conventionally used to test a logic circuit portion in a semiconductor integrated circuit include a scan test method. In order to perform a scan test, it is necessary to form a scan test circuitry in the semiconductor integrated circuit. A typical scan test circuitry is formed using a plurality of scan flip flop circuits in the semiconductor integrated circuit. Each scan flip flop circuit used has an input terminal D, an input terminal DT, a clock terminal CK, an input terminal NT, and a pair of output terminals Q and NQ. At the input terminal D, the flip flop circuit receives a data signal propagated through a circuit block (a combinational circuit). At the input terminal DT, the flip flop circuit receives a scan test signal. The clock terminal CK is used to receive a clock signal. At the input terminal NT, either the signal at the input terminal D or the signal at the input terminal DT is selected as data to be input to the flit flop circuit. From the pair of output terminals Q and NQ, the flip flop circuit outputs data signals.

The scan test circuitry has two modes. These modes are switched according to the value at the terminal NT. Specifically, when the value of the signal at the terminal NT is 1 (this state is called shift mode), the signal at the terminal DT is received by the flip flop circuit as input data. When the value of the signal at the terminal NT is 0 (this state is called capture mode), the signal at the terminal D is received by the flip flop circuit as input data.

The scan test circuitry, which is configured by sequentially connecting the terminals DT and the terminals Q (or NQ) of the scan flip flop circuits with one another, functions as a shift register during shift mode (NT=1) in scan test. An external input terminal, functioning as a scan-test-signal input terminal, is connected to the terminal DT of the scan flip flop circuit provided at the head of the shift register, while an external output terminal, acting as a scan-test-signal output terminal, is connected to the terminal Q or NQ of the scan flip flop circuit disposed in the last stage of the shift register. The terminals CK and NT of the scan flip flop circuits are directly controlled by external input terminals. The scan test circuitry thus configured is also called a scan chain, because the scan flip flop circuits are connected in the form of a chain. The semiconductor integrated circuit may include a plurality of scan chains.

In a typical scan test, an LSI tester supplies scan test signals to the scan-test-signal input terminal. The LSI tester also directly supplies a clock signal and a scan enable signal to the terminals CK and the terminals NT of the scan flip flop circuits, respectively.

While supplying a signal value of 1 as a scan enable signal, the LSI tester applies a clock signal during a period of time in which the number of rising edges of the clock signal is equal to the number of scan flip flop circuits in the scan chain, whereby scan test signals are supplied to all of the scan flip flop circuits forming the scan chain. Thereafter, the scan enable signal is switched to 0, and then one clock is input, whereby signals from the circuit block are captured by the terminals D of the scan flip flop circuits. Then, the scan enable signal is switched again to 1, and a clock signal is applied during a period of time in which the number of rising edges of the clock signal is equal to the number of scan flip flop circuits in the scan chain, whereby the signal values captured by the respective scan flip flop circuits are captured into the LSI tester.

The signal values captured into the LSI tester are then compared with expected values stored beforehand in the LSI tester so as to determine whether or not the captured signal values are appropriate.

In recent years, a logic circuit portion in a semiconductor integrated circuit is being tested using a built-in self-test (BIST) device, instead of performing a typical scan test. The most popular BIST architectures for testing a logic circuit portion include STUMPS (hereinafter, BIST for logic circuit portion will be referred to as "logic BIST"). STUMPS is a BIST architecture based on multiple scan designs. Like a scan test system, a STUMPS architecture uses a scan chain formed in the semiconductor integrated circuit, when performing a test.

The differences between logic BIST and scan test are a test-signal producing circuit and an output-response-signal comparison circuit. In scan testing, test signals are produced and an output-response-signal comparison circuit functions in the manners as described above. On the other hand, in logic BIST, control signals, such as a BIST seizure signal, a clock signal and the like, are applied from an LSI tester, whereby a test signal is produced from a pattern generation circuit included in the semiconductor integrated circuit, and the test signal is then applied to the target circuit to be tested. An output response signal from the circuit under test is input into an output compression circuit, in which the output response signal is converted into compressed data called signature. Finally, the signature is read into the LSI tester so as to be compared with the expected value thereof stored beforehand in the LSI tester, thereby determining whether or not the output signature is appropriate.

The number of devices included in a semiconductor integrated circuit has been increasing recently. Along with this increase, the amount of necessary test data has also been increasing. Furthermore, as technology for microscaling semiconductor fabrication processes has progressed, operation of a system-on-a-chip is adversely affected by small defects, which did not cause any problems before. High-resistance vias, short circuits, crosstalk, and other defects have manifested themselves as delay faults. Therefore, in addition to conventionally needed test data for stack-fault detection, test data for delay-fault detection is also required to be provided. Herein, the amount of test data required in scan test or in logic BIST means the amount of binary data obtained by multiplying the number of bits corresponding to the number of all scan flip flop circuits by the number of captures.

In order to complete a test on a semiconductor integrated circuit (whether typical scan testing or typical logic BIST) in a short time, shift operation has to be performed at high speed for quick setting of test data in the scan chain, so that as many circuit blocks as possible can be tested simultaneously. Since the running cost of an LSI tester is very high, if the tester is used for a long time, the final manufacturing cost of the semiconductor integrated circuit will be affected significantly.

However, in scan test or logic BIST conducted in a semiconductor integrated circuit including numerous devices, high-speed shift operation of the scan chain formed for testing many blocks in the semiconductor integrated circuit causes the semiconductor integrated circuit to consume a significant amount of power, such that normal operation and thus appropriate test cannot be performed. In view of this, it is very important to reduce the power consumption required by shift operation performed in scan test or in logic BIST.

Therefore, Japanese Laid-Open Publication No. 2001-59856, for example, discloses a conventional method to overcome this problem. In this method, when shift operation is performed, output terminals (terminals Q), which transmit data from scan flip flop circuits to a function block (combinational circuit), are fixed, thereby reducing power consumption during the scan test.

FIG. 29 illustrates the configuration of a semiconductor integrated circuit disclosed in the above-mentioned publication. The semiconductor integrated circuit includes a combinational circuit 10 and a plurality of flip flop circuits 11A to 11F. This circuit has the following features. Each of the flip flop circuits 11A to 11F is provided with a terminal SO for transmitting a scan test signal DT to the next flip flop circuit in the scan chain, in addition to a terminal Q for transmitting a data signal D and the scan test signal DT. During shift mode in scan test, the signal values at the terminals Q are kept fixed so that the state within the combinational circuit 10 is not changed.

In previous scan testing circuitry configurations, the signal value at the terminal Q of each scan flip flop circuit varies during shift mode according to a scan test signal applied to the scan flip flop circuit. At this time, many transistors within the combinational circuit simultaneously perform switching, thereby momentarily consuming a considerable amount of power. On the other hand, in the circuit shown in FIG. 29, the signal values at the terminals Q are kept fixed during shift operation, whereby the value at each node within the combinational circuit is fixed, thereby allowing the power consumption to be suppressed during the shift operation.

FIGS. 30 and 31 illustrate the specific flip flop circuit configurations for fixing the output value of the terminal Q, disclosed in the above-mentioned publication.

The flip flop circuit shown in FIG. 30 includes a multiplexer 21, a first latch circuit 22, a second latch circuit 23, an AND circuit 24, and a third latch circuit 25. The multiplexer 21 receives a data signal D and a scan test signal DT and selects as output either the signal D or the signal DT according to the value of a scan enable signal NT. The first latch circuit 22 latches the output signal of the multiplexer 21 according to the inversion signal of a clock signal CLK. The second latch circuit 23 latches the output of the first latch circuit 22 according to the clock signal CLK. The AND circuit 24 receives the clock signal CLK and the inversion signal of a HOLD signal and outputs the result of AND operation of those signals. The third latch circuit 25 latches the output of the second latch circuit 23 according to the output of the AND circuit 24. The output of the second latch circuit 23 functions as a terminal SO, while the output of the third latch circuit 25 acts as an output terminal Q.

In this configuration, when the HOLD signal is 1, the output of the AND circuit 24 is always 0 irrespective of whether the clock signal CLK is 1 or 0. Therefore, at this time, the output Q of the third latch circuit 25 is fixed at the value (0 or 1) held at the previous time regardless of the output value of the first latch circuit 22.

A scan flip flop circuit 11A' shown in FIG. 31 includes a flip flop circuit 31 and an AND circuit 32. In the flip flop circuit 31, the terminal Q of the conventional scan flip flop circuit 11A of FIG. 30 is configured so as to function as a terminal SO. The AND circuit 32 receives the inversion signal of a HOLD signal and the output of the flip flop circuit 31, and then outputs the result of AND operation of these signals. The output of the AND circuit 32 is the output of the output terminal Q. In this configuration, when the HOLD signal is 1, the output of the AND circuit 32 is always 0 irrespective of whether the output of the flip flop circuit 31 is 1 or 0.

In these conventional techniques, power consumption can be suppressed, but penalties are likely to occur in the circuit area and the speed of performing function. Specific penalties are described in the following.

For example, in the conventional flip flop circuit shown in FIG. 30, area overhead increases by one latch circuit and one AND gate as compared with a typical scan flip flop circuit.

In the conventional flip flop circuit shown in FIG. 31, area overhead increases by one AND gate as compared with a typical scan flip flop circuit. The area of this flip flop circuit is thus smaller than that of the flip flop circuit of FIG. 30 by the one latch circuit. However, in this flip flop circuit, unlike in the flip flop circuit of FIG. 30, the AND gate 32 is provided behind the flip flop circuit 31, causing the signal propagation speed of the output Q to be delayed by the one AND gate.

Therefore, the conventional flip flop circuits shown in FIGS. 30 and 31, which are capable of suppressing power consumption, have disadvantages in that the circuit area increases and the operation speed decreases.

SUMMARY OF THE INVENTION

It is therefore an object of the present invention to effectively reduce power consumption during shift operation in scan testing and in logic BIST without increasing the circuit area and without adversely affecting the speed of performing function.

In order to achieve the above object, the present invention employs a structure in which only power supply voltage to a combinational circuit can be lowered during shift operation in scan testing and in logic BIST, thereby reducing power consumption in the combinational circuit.

Specifically, an inventive semiconductor integrated circuit includes: a combinational circuit; a plurality of flip flop circuits for holding a plurality of output signals from the combinational circuit; flip-flop-circuit power source wiring for supplying power supply voltage to the flip flop circuits; and combinational-circuit power source wiring for supplying power supply voltage to the combinational circuit, wherein the flip-flop-circuit power source wiring and the combinational-circuit power source wiring are separate from each other and provide the power supply to the flip flop circuits and the power supply to the combinational circuit, respectively.

Another inventive semiconductor integrated circuit includes: a combinational circuit; a plurality of flip flop circuits for holding a plurality of output signals from the combinational circuit; power source wiring for supplying power supply voltage to the flip flop circuits and the combinational circuit; and a power source cut-off circuit for cutting off the power supply voltage of the power source wiring to the combinational circuit.

In one embodiment of the present invention, the combinational circuit includes a plurality of blocks, and the power source cut-off circuit is disposed in each of the blocks.

In another embodiment of the present invention, an input terminal of each flip flop circuit is connected to an output terminal of the combinational circuit, and the semiconductor integrated circuit includes an intermediate-potential prevention circuit for preventing the input terminals of the flip flop circuits from having an intermediate potential.

In another embodiment of the present invention, the circuit further includes a variable power supply circuit for varying the power supply voltage of the flip-flop-circuit power source wiring and the power supply voltage of the combinational-circuit power source wiring.

In another embodiment, the flip flop circuits form a scan chain.

In another embodiment, during capture operation in which the output signals from the combinational circuit are captured into the flip flop circuits, the power supply voltage of the combinational-circuit power source wiring is set to a given voltage, and during shift operation for scan test signals provided in scan testing, in which the flip flop circuits are serially connected one after another, the power supply voltage of the combinational-circuit power source wiring is set to a voltage lower than the given voltage.

In another embodiment, during capture operation in which the output signals from the combinational circuit are captured into the flip flop circuits, the power supply voltage of the flip-flop-circuit power source wiring is set to a given voltage, and during shift operation for scan test signals provided in scan testing, in which the flip flop circuits are serially connected one after another, the power supply voltage of the flip-flop-circuit power source wiring is set to a voltage higher than the given voltage.

In another embodiment, the circuit further includes a built-in self-test device for performing a self-test of the combinational circuit.

In another embodiment, the circuit further includes: a measuring circuit for measuring a period of restoring time required for variation in the power supply voltage supplied from each power source wiring to be restored to a steady state, and a stop control circuit for stopping supply of a clock signal to the flip flop circuits during the period of restoring time.

In another embodiment, the circuit further includes: a first region, in which a plurality of flip-flop-circuit standard cells are provided; a second region, in which a plurality of combinational-circuit standard cells are provided; first power source wiring for supplying power to the flip-flop-circuit standard cells that form the first region; and second power source wiring for supplying power to the combinational-circuit standard cells that form the second region.

In another embodiment, the flip-flop-circuit standard cells are arranged in rows and the combinational-circuit standard cells are arranged in rows, the rows of the flip-flop-circuit standard cells and the rows of the combinational-circuit standard cells extending in the same direction; and the rows of the flip-flop-circuit standard cells and the rows of the combinational-circuit standard cells are arranged alternately.

In another embodiment, the circuit further includes a flip-flop-circuit standard cell and a combinational-circuit standard cell, and the combinational-circuit standard cell includes a power source cut-off circuit.

In another embodiment, the circuit further includes a plurality of standard cells, each of which includes therein: first power source wiring for supplying power to the flip flop circuits; and second power source wiring for supplying power to the combinational circuit, wherein power supply from the flip-flop-circuit power source wiring to the first power source wiring in each standard cell, and power supply from the combinational-circuit power source wiring to the second power source wiring in each standard cell are performed independently of each other.

An inventive semiconductor integrated circuit testing method for testing the semiconductor integrated circuits includes: the first step of lowering the power supply voltage to the combinational circuit; the second step of setting scan test data in the flip flop circuits, after the first step has been performed; the third step of raising the power supply voltage to the combinational circuit, after the second step has been performed; and the fourth step of operating the combinational circuit, after the third step has been performed.

Another inventive semiconductor integrated circuit testing method for testing the semiconductor integrated circuit includes: the first step of lowering the power supply voltage to the combinational circuit; the second step of setting scan test data in the flip flop circuits, after the first step has been performed; the third step of separately raising the power supply voltage to each block in the combinational circuit, after the second step has been performed; and the fourth step of operating the combinational circuit, after the third step has been performed.

In one embodiment of the present invention, in the first step, the power supply to the combinational circuit is cut off.

Another inventive semiconductor integrated circuit testing method for testing the semiconductor integrated circuit includes: the first step of lowering the power supply voltage to the combinational circuit; the second step of setting scan test data in the flip flop circuits, after the first step has been performed; the third step of raising the power supply voltage to the combinational circuit, after the second step has been performed; the fourth step of stopping supply of a clock signal to the flip flop circuits for a certain period of time, after the third step has been performed; and the fifth step of operating the combinational circuit, after the fourth step has been performed.

Another inventive semiconductor integrated circuit testing method for testing the semiconductor integrated circuit includes: the first step of lowering the power supply voltage to the combinational circuit; the second step of setting scan test data in the flip flop circuits, after the first step has been performed; the third step of separately raising the power supply voltage to each of blocks in the combinational circuit, after the second step has been performed; the fourth step of stopping supply of a clock signal to the flip flop circuits for a certain period of time, after the third step has been performed; and the fifth step of operating the combinational circuit, after the fourth step has been performed.

In one embodiment of the present invention, in the second step, the power supply to the combinational circuit is cut off.

Another inventive semiconductor integrated circuit testing method for testing the semiconductor integrated circuit includes: the first step of raising the power supply voltage to the flip flop circuits; the second step of setting scan test data in the flip flop circuits, after the first step has been performed; the third step of lowering the power supply voltage to the flip flop circuits, after the second step has been performed; and the fourth step of operating the combinational circuit, after the third step has been performed.

Another inventive semiconductor integrated circuit testing method for testing the semiconductor integrated circuit includes: the first step of raising the power supply voltage to the flip flop circuits; the second step of setting scan test data in the flip flop circuits, after the first step has been performed; the third step of lowering the power supply voltage to the flip flop circuits, after the second step has been performed; the fourth step of stopping supply of a clock signal to the flip flop circuits for a certain period of time, after the third step has been performed; and the fifth step of operating the combinational circuit, after the fourth step has been performed.

In the inventive semiconductor integrated circuits and the inventive test methods, during shift operation in scan testing, the power supply voltage to the combinational circuit is cut off or set to a lower voltage as compared with capture operation, thereby effectively suppressing the amount of power consumed by the combinational circuit during the shift operation. If, during the shift operation, the power supply voltage to the flip flop circuits is set to a higher voltage as compared with capture operation, the shift operation by the flip flop circuits is performed at higher speed, thereby effectively reducing the test time.

In the present invention, the reduction in the power consumed by the combinational circuit during the shift operation, and the reduction in the test time are achieved just by lowering the power supply voltage to the combinational circuit and by raising the power supply voltage to the flip flop circuits. Therefore, unlike in the conventional circuits and conventional test methods, these advantages can be obtained without increasing the circuit area or decreasing the operating speed. In addition, since the power to the combinational circuit is cut off during shift operation, it is possible to reduce not only the amount of power consumed by the switching operation by the transistor in the combinational circuit, but also the amount of power consumed by leakage current occurring in the CMOS transistor being in a static state. Such leakage current is caused by the thinning of the gate insulating film of the transistor and has been arising as a problem recently.

Also, according to one embodiment of the present invention, an intermediate-potential prevention circuit prevents the input terminals of the flip flop circuits from having an intermediate potential while the power supply voltage to the combinational circuit is cut off, thereby effectively preventing excessive leakage current flow in, and damage to, the combinational circuit.

Moreover, according to one embodiment of the present invention, during shift operation in scan testing, the power supply voltage to the combinational circuit is lowered or cut off, or the power supply voltage to the flip flop circuits is raised, whereby the power consumption is reduced, or the test time is shortened. Then, supply of a clock signal to the flip flop circuits is stopped only for a certain period of time before the following capture operation is performed, thereby providing a certain waiting time before the capture operation. The presence of waiting time allows the combinational circuit and the flip flop circuits to operate in normal operation mode with normal power supply voltage being supplied, whereby stable test on the combinational circuit is ensured.

BRIEF DESCRIPTION OF THE DRAWINGS

FIG. 1 illustrates a semiconductor integrated circuit including a scan chain according to a first embodiment of the present invention.

FIG. 2 illustrates a semiconductor integrated circuit including no scan chain according to a first modified example of the first embodiment of the present invention.

DETAILED DESCRIPTION OF THE INVENTION

Figure 3A:
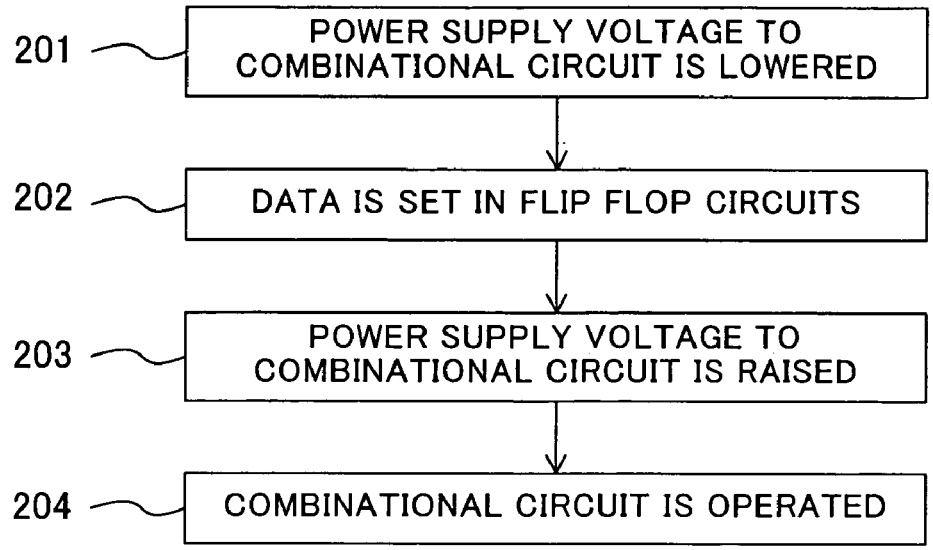
FIG. 3A indicates a method for testing the semiconductor integrated circuit of the first embodiment of the present invention, while FIG. 3B indicates a modified example of the test method of FIG. 3A.

Hereinafter, semiconductor integrated circuits and methods for testing the same according to preferred embodiments of the present invention will be described with reference to the accompanying drawings.

FIRST EMBODIMENT

Hereinafter, a semiconductor integrated circuit and a method for testing the same according to a first embodiment of the present invention will be described.

FIG. 1 is a circuit diagram illustrating the configuration of the semiconductor integrated circuit of the first embodiment. In FIG. 1, the reference numeral 101 denotes a combinational circuit. The reference numerals 102a to 102f indicate flip flop circuits. The reference numeral 103 refers to flip-flop-circuit power source wiring for supplying power supply voltage to the flip flop circuits 102a to 102f, while the reference numeral 104 represents combinational-circuit power source wiring for supplying power supply voltage to the combinational circuit 101. The power source wiring 103 and the power source wiring 104 are separate from, and function independently of, each other, such that the power source wiring 103 can apply a power supply voltage VDD1 to the flip flop circuits 102a to 102f, and the power source wiring 104 can apply to the combinational circuit 101 a power supply voltage VDD2, which is different from the power supply voltage VDD1.

In this configuration, the value of the voltage applied to the flip flop circuits and the value of the voltage applied to the combinational circuit can be individually adjusted in accordance with operation of the flip flop circuits and operation of the combinational circuit, respectively, whereby power consumption during the operation can be controlled. For example, the voltage applied to the flip flop circuits 102a to 102f can be adjusted according to variations in the clock frequency that occur during operation of the flip flop circuits 102a to 102f, or the voltage applied to the combinational circuit 101 can be adjusted in accordance with whether or not the combinational circuit 101 is performing necessary operation, whereby power consumption during the operation can be effectively reduced.

The above-mentioned advantage can be obtained in shift operation in scan testing, for example. The flip flop circuits 102a to 102f shown in FIG. 1 form a scan chain during shift operation performed in scan test. During the shift operation in scan test, the flip flop circuits 102a to 102f capture scan test signals on the scan chain, and thus do not capture the results of operation performed by the combinational circuit 101. This means that during the shift operation in scan test, the combinational circuit 101 is performing unnecessary operation and thus consuming power unnecessarily. During shift operation in scan test, all devices in a circuitry portion under test operate simultaneously, consuming very large amounts of power. However, in many cases, power supply design for a semiconductor integrated circuit is performed in consideration of power consumption during function operation. As in those cases, if power supply design is performed without taking power consumption during testing into account, there is a high probability that unnecessary power consumption occurring during shift operation in scan testing exceeds the expected power consumption obtained at the time of the design. In that case, the operating frequency has to be lowered to reduce the power consumption so as to perform the shift operation properly. This is because the power consumption in the semiconductor integrated circuit is proportional to the operating frequency.

Nevertheless, such reduction in the operating frequency becomes a problem in cases in which high-speed shift operation is desired to reduce the test time. During shift operation, from the scan-in terminal, desired test data is serially set in the shift register, in which the flip flop circuits 102a to 102f are connected in a serial manner. The number of clock cycles required by this test data setting is equal to the number of flip flop circuits connected in the scan chain. Therefore, if the operating frequency during the shift operation is low, the amount of test time is increased, resulting in increase in the product cost. In view of this, it is desired that the operating frequency during shift operation be as high as possible.

In the semiconductor integrated circuit shown in FIG. 1, this problem is overcome. The amount of power consumed by a semiconductor integrated circuit is proportional to the square of power supply voltage VDD. In the semiconductor integrated circuit of FIG. 1, the power source wiring 103 for the flip flop circuits 102a to 102f and the power source wiring 104 for the combinational circuit 101 are separate from each other, whereby during shift operation, only the level of the power supply voltage VDD2 to the combinational circuit 101 can be lowered or the power supply itself can be cut off, thereby reducing the amount of power consumed by the combinational circuit 101 portion during the shift operation. In addition, it is possible to perform the shift operation at higher speed by raising the level of the power supply voltage to the flip flop circuits 102a to 102f during the shift operation.

First Modified Example of the First Embodiment

Even in a semiconductor integrated circuit in which no scan design has been implemented, if data can be set in flip flop circuits 102a to 102f from external input terminals as shown in FIG. 2, operation by a combinational circuit 101 is not necessary during the period of time in which the data is set in the flip flop circuits 102a to 102f. In this modified example, it is possible to suppress unnecessary power consumption by the combinational circuit 101 portion during this time period.

FIG. 3A indicates a test method in which the above-mentioned advantage of the semiconductor integrated circuit of FIG. 1 is utilized. The test method shown in FIG. 3A includes four steps 201 to 204. In the first step 201, the power supply voltage to a combinational circuit is lowered. In the second step 202, data is set in flip flop circuits. In the third step 203, the power supply voltage to the combinational circuit is raised. In the fourth step 204, the combinational circuit is operated.

Figure 4:
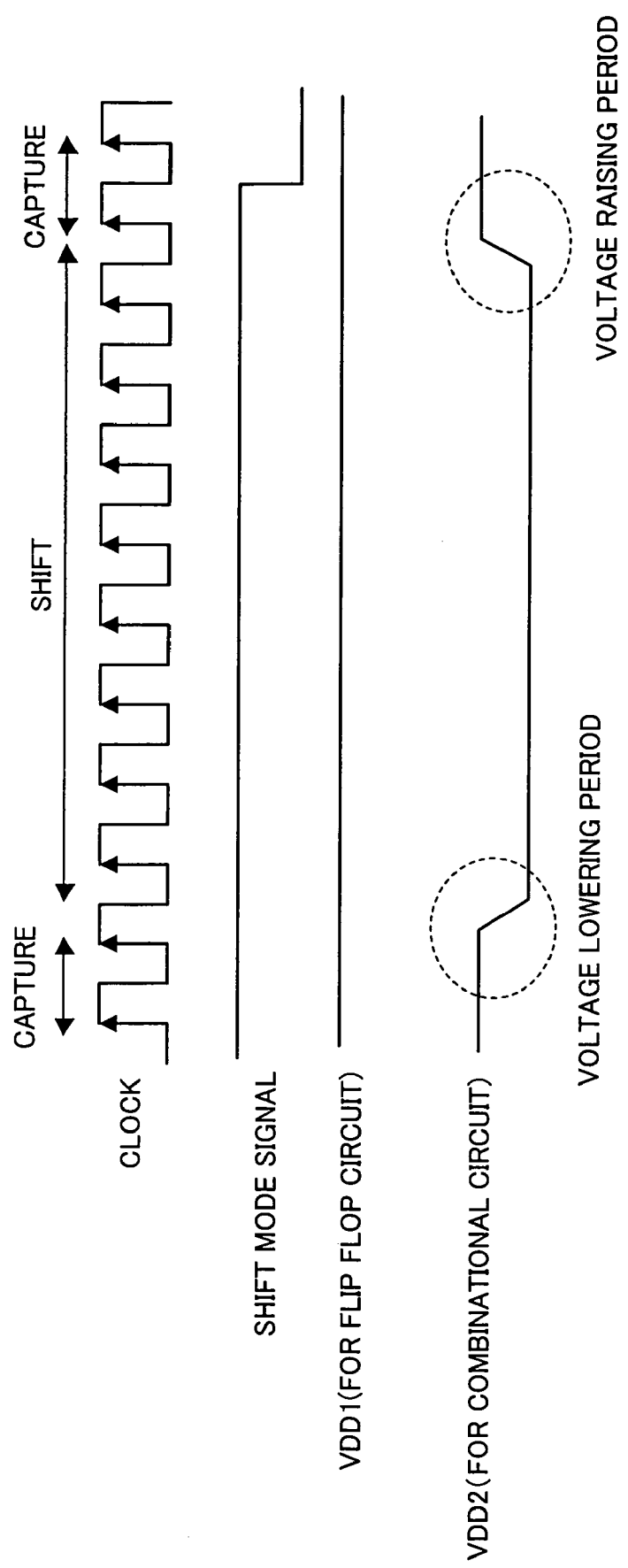
FIG. 4 is a time chart indicating the test method of FIG. 3A.

A scan test conducted in the semiconductor integrated circuit of FIG. 1 in accordance with the method of FIG. 3A is shown in a time chart in FIG. 4. First, the value of the power supply voltage VDD2 to the combinational circuit 101 is lowered. Test data is then set in the flip flop circuits 102a to 102f by shift operation. Thereafter, the value of the power supply voltage VDD2 is raised, the test conditions are satisfied, and the combinational circuit 101 is operated by capture operation. These steps are repeated a certain number of times to complete the scan test.

Second Modified Example of the First Embodiment

A typical semiconductor integrated circuit is not always designed so as to be capable of withstanding high-speed shift operation when the power supply voltage for normal operation is applied to the semiconductor integrated circuit. Even so, since the semiconductor integrated circuit of FIG. 1 is configured so that during shift operation, a voltage higher than that supplied in normal operation can be applied only to the flip flop circuits, the shift operation can be performed at high speed.

Figure 5A:
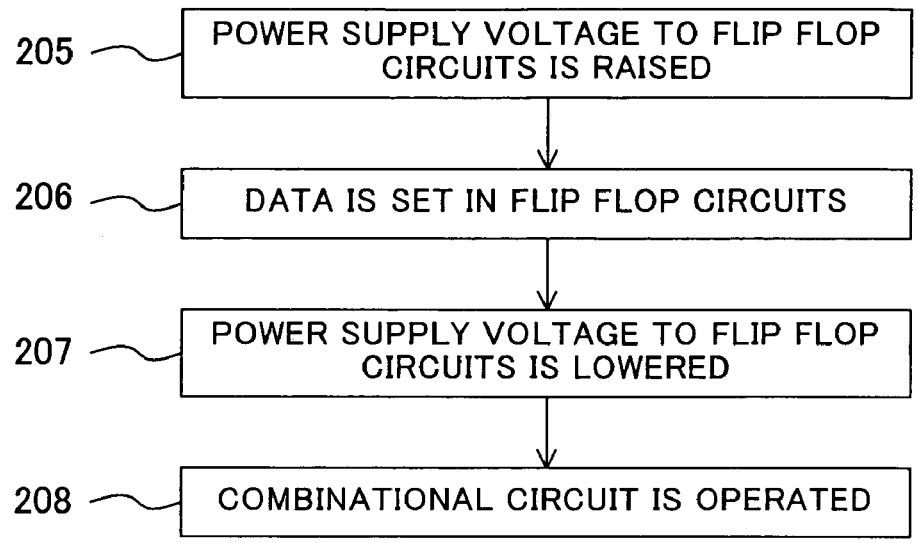
FIG. 5A indicates a method for testing a semiconductor integrated circuit according to a second modified example of the first embodiment of the present invention, while FIG. 5B indicates a modified example of the test method of FIG. 5A.

FIG. 5A indicates a test method for realizing the above-described high-speed shift operation. The test method shown in FIG. 5A includes four steps 205 to 208. In the first step 205, the power supply voltage to the flip flop circuits is raised. In the second step 206, test data is set in the flip flop circuits. In the third step 207, the power supply voltage to the flip flop circuits is lowered. In the fourth step 208, the combinational circuit is operated. By performing the test method of FIG. 5A together with the test method of FIG. 3A, it is possible to reduce both the power consumption and the amount of test time.

Figure 6:
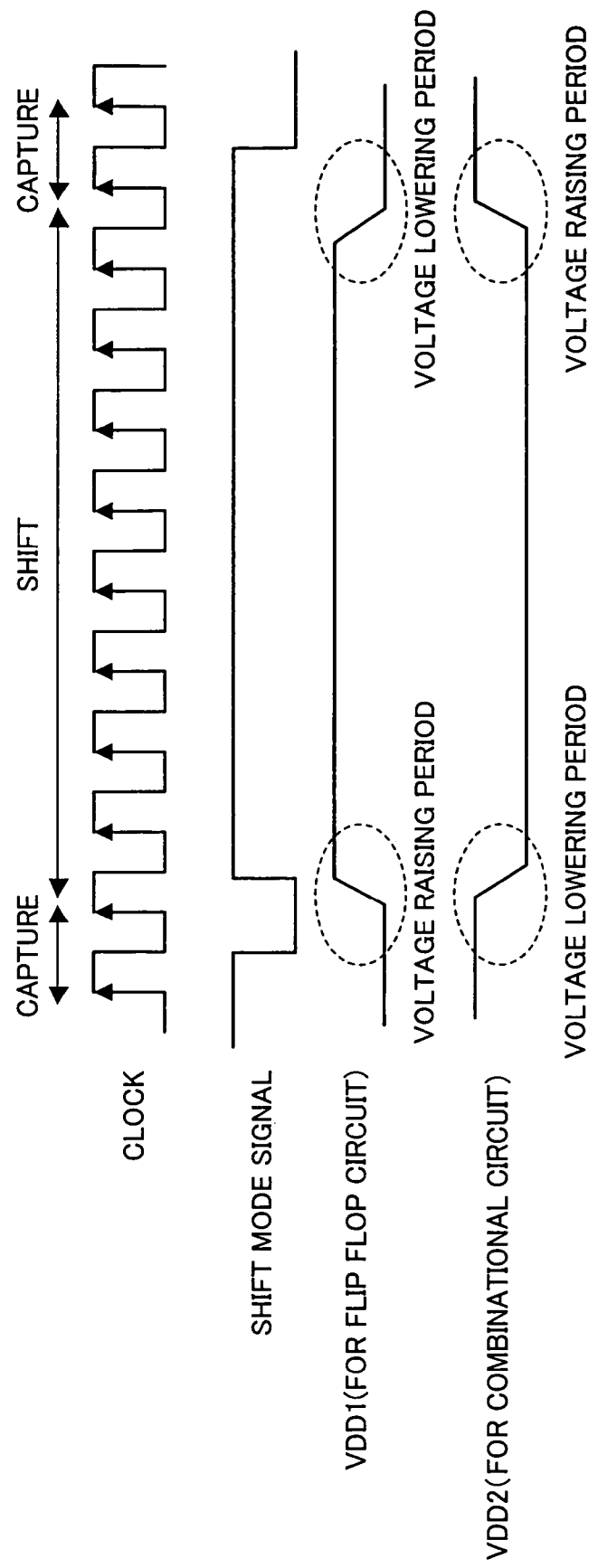
FIG. 6 is a time chart indicating a case in which the test methods of FIGS. 3A and 5A are both performed.

A case in which the test methods of FIGS. 3A and 5A are both performed is shown in a time chart in FIG. 6. First, the value of power supply voltage VDD2 to the combinational circuit 101 is lowered, while at the same time the power supply voltage VDD1 to the flip flop circuits 102a to 102f is raised. Test data is then set in the flip flop circuits 102a to 102f by shift operation. Thereafter, the value of the power supply voltage VDD2 is raised, while at the same time the power supply voltage VDD1 is lowered. The test conditions are then satisfied, and the combinational circuit is operated by capture operation. These steps are repeated a certain number of times to complete the scan test.

Third Modified Example of the First Embodiment

Figure 7:
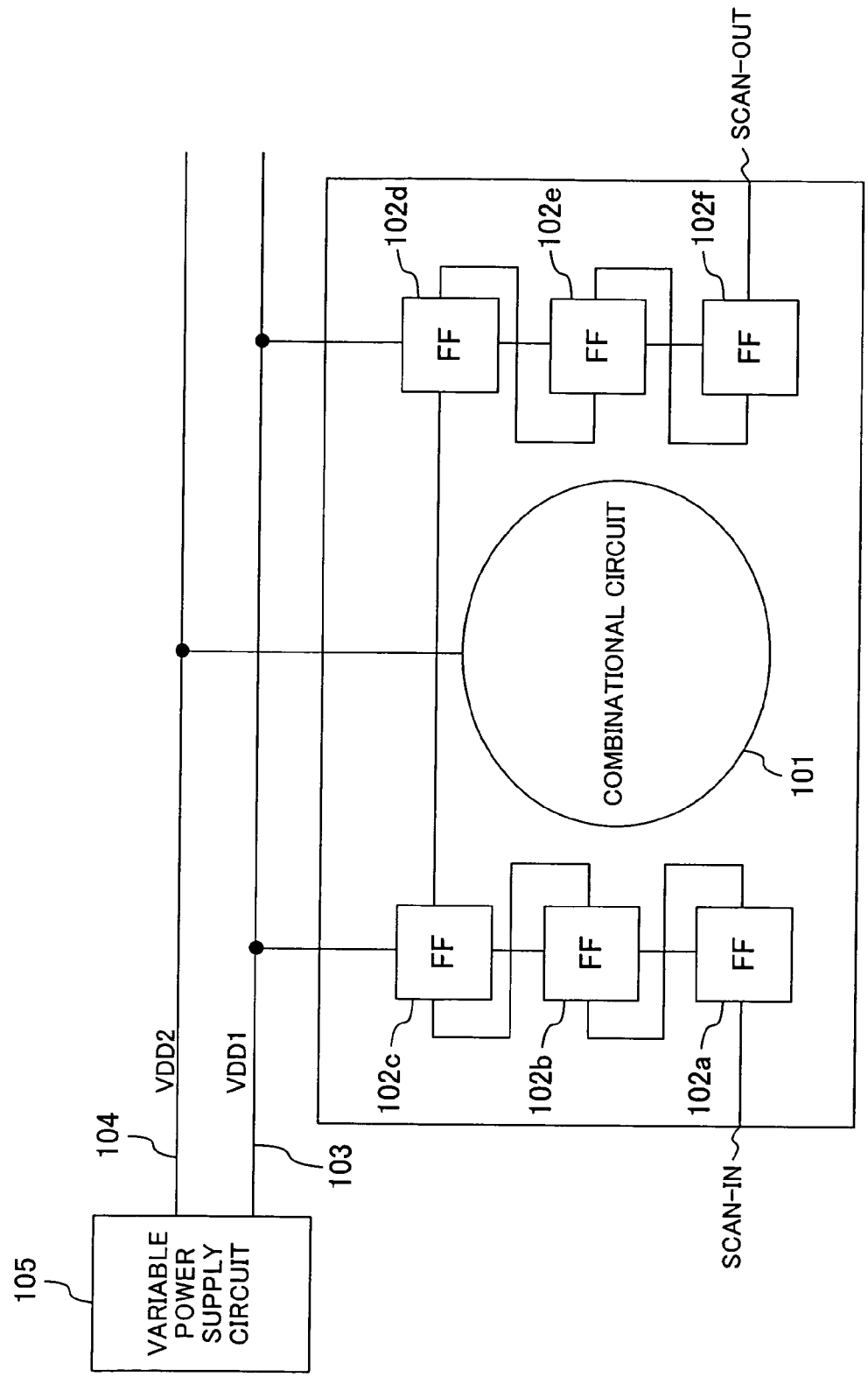
FIG. 7 illustrates a semiconductor integrated circuit including a variable power supply circuit according to a third modified example of the first embodiment of the present invention.

In the semiconductor integrated circuit of the first embodiment, the two power supply voltages VDD1 and VDD2 may be supplied from devices external to the semiconductor integrated circuit, or may be supplied by a variable power supply circuit included in the semiconductor integrated circuit. FIG. 7 illustrates a semiconductor integrated circuit provided with a variable power supply circuit. In FIG. 7, the reference numeral 105 denotes the variable power supply circuit.

Fourth Modified Example of the First Embodiment

Figure 8:
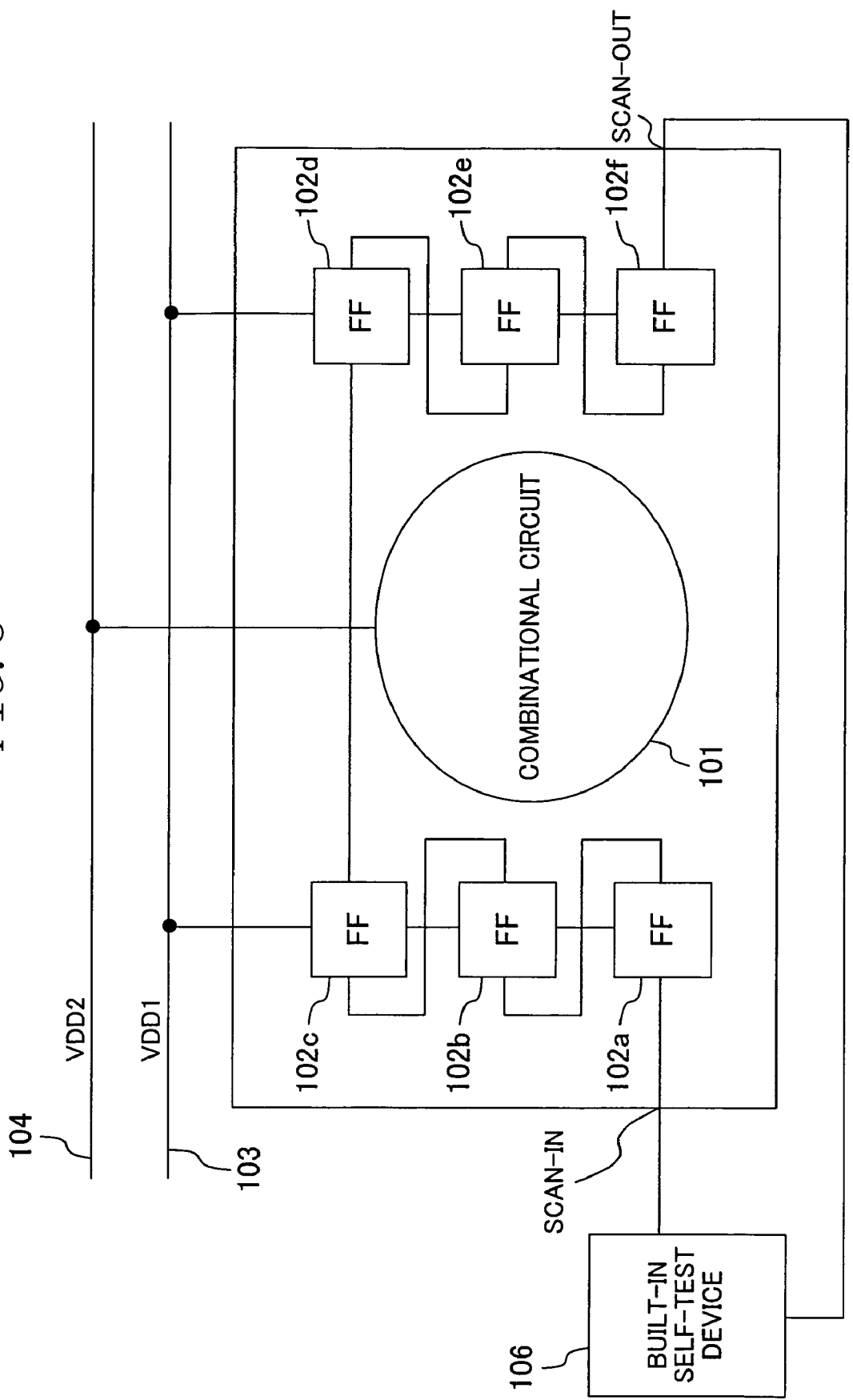
FIG. 8 illustrates a semiconductor integrated circuit including a built-in self-test device according to a fourth modified example of the first embodiment of the present invention.

Moreover, in the semiconductor integrated circuit of the first embodiment of the present invention, the test data to the scan chain may be supplied from a device external to the semiconductor integrated circuit, or may be supplied from a built-in self-test (BIST) device included in the semiconductor integrated circuit. FIG. 8 illustrates a semiconductor integrated circuit provided with a built-in self-test device. In FIG. 8, the reference numeral 106 indicates the built-in self-test device, which includes a block for supplying test data to the scan chain and a block for compressing output data from the scan chain.

Fifth Modified Example of the First Embodiment

Furthermore, the semiconductor integrated circuit of the first embodiment of the present invention may be provided with a counter for measuring a certain period of time required for voltage newly selected in power-supply-voltage switching to become stable, and a circuit for stopping supply of a clock signal during that measured time period.

Figure 9:
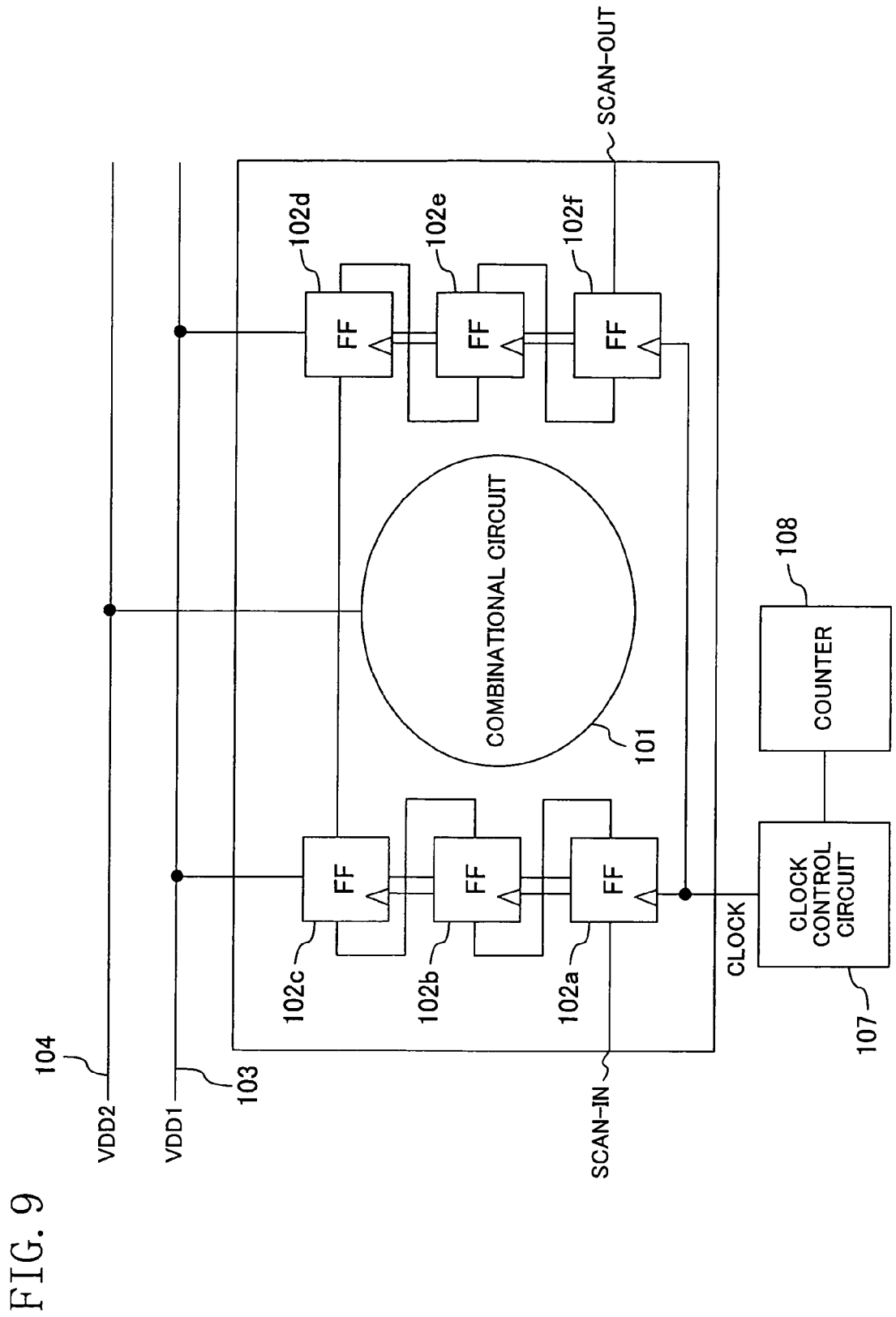
FIG. 9 illustrates a semiconductor integrated circuit which includes a clock control circuit and a counter according to a fifth modified example of the first embodiment of the present invention.

FIG. 9 illustrates a semiconductor integrated circuit which includes such a counter and a clock control circuit. In FIG. 9, the reference numeral 107 denotes the clock control circuit (stop control circuit), while the reference numeral 108 refers to the counter (measuring circuit). The counter 108 measures a period of time in which supply of a clock signal should be stopped. During that time period, a signal that instructs the clock control circuit 107 to stop the supply of the clock signal to the flip flop circuits is given to the clock control circuit 107. As a result, the clock signal supply to the flip flop circuits is stopped during that time period, causing the semiconductor integrated circuit to stop its operation. During this stop period, the power supply voltages are switched.

Figure 3B:
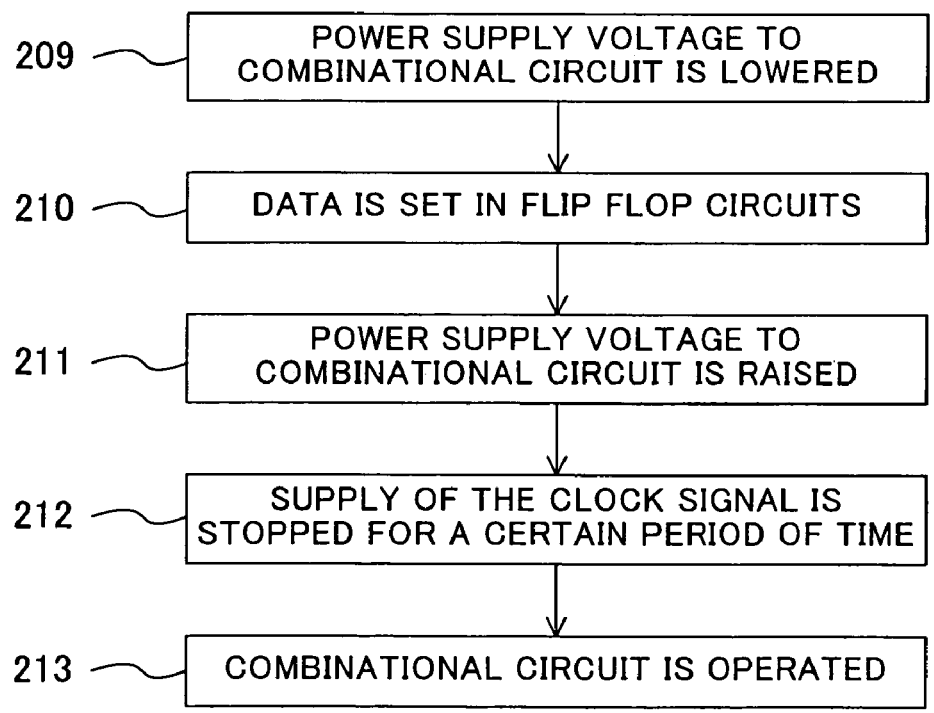

FIG. 3B indicates a method for testing a semiconductor integrated circuit that includes a counter 108 for measuring a certain period of time required for voltage newly selected in power-supply-voltage switching to become stable, and a clock control circuit 107 for stopping supply of a clock signal to the flip flop circuits during that time period. The test method shown in FIG. 3B includes five steps 209 to 213. In the first step 209, the power supply voltage to the combinational circuit is lowered. In the second step 210, test data is set in the flip flop circuits. In the third step 211, the power supply voltage to the combinational circuit is raised. In the fourth step 212, the supply of the clock signal to the flip flop circuits 102a to 102f is stopped for a certain period of time. In the fifth step 213, the combinational circuit is operated.

Figure 5B:
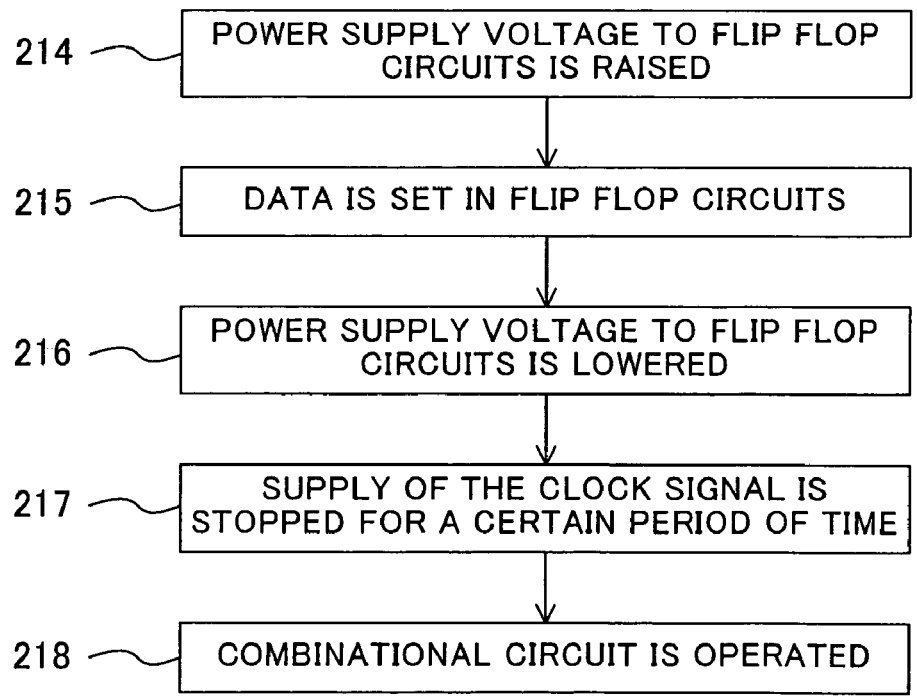

FIG. 5B indicates another method for testing the semiconductor integrated circuit that includes the counter 108 for measuring a certain period of time required for voltage newly selected in power-supply-voltage switching to become stable, and the clock control circuit 107 for stopping supply of a clock signal during that time period. The test method shown in FIG. 5B includes five steps 214 to 218. In the first step 214, the power supply voltage to the flip flop circuits is raised. In the second step 215, test data is set in the flip flop circuits. In the third step 216, the power supply voltage to the flip flop circuits is lowered. In the fourth step 217, the supply of a clock signal to the flip flop circuits 102a to 102f is stopped for a certain period of time. In the fifth step 218, the combinational circuit is operated.

Figure 10:
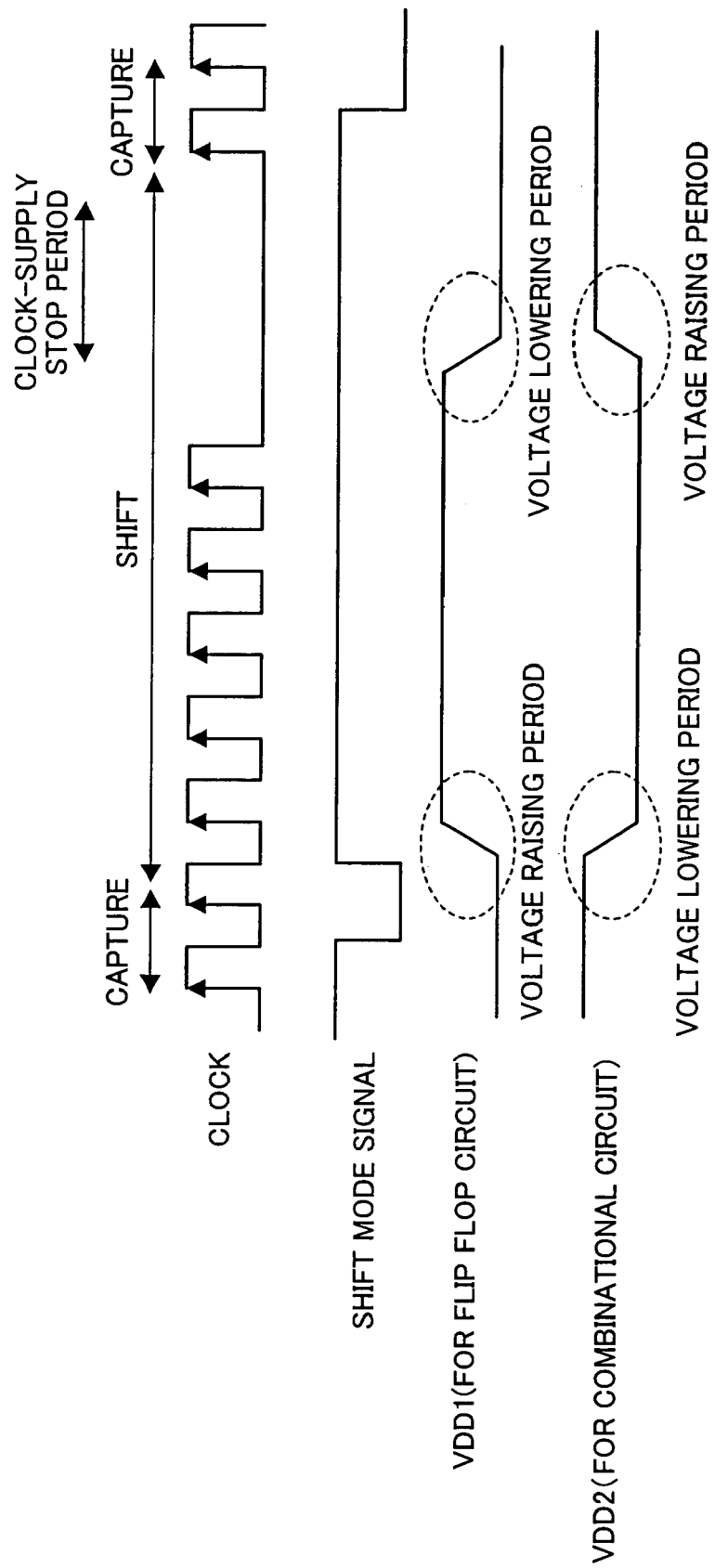
FIG. 10 is a time chart indicating operation of the semiconductor integrated circuit according to the fifth modified example of the first embodiment of the present invention.

FIG. 10 is a time chart indicating a case in which the supply of a clock signal is stopped for a certain period of time, when the power-supply-voltage switching is performed before the combinational circuit is operated by capture operation. The time period in which the supply of a clock signal is stopped is a time period required for the newly selected power supply voltages to become stable.

Figure 11:
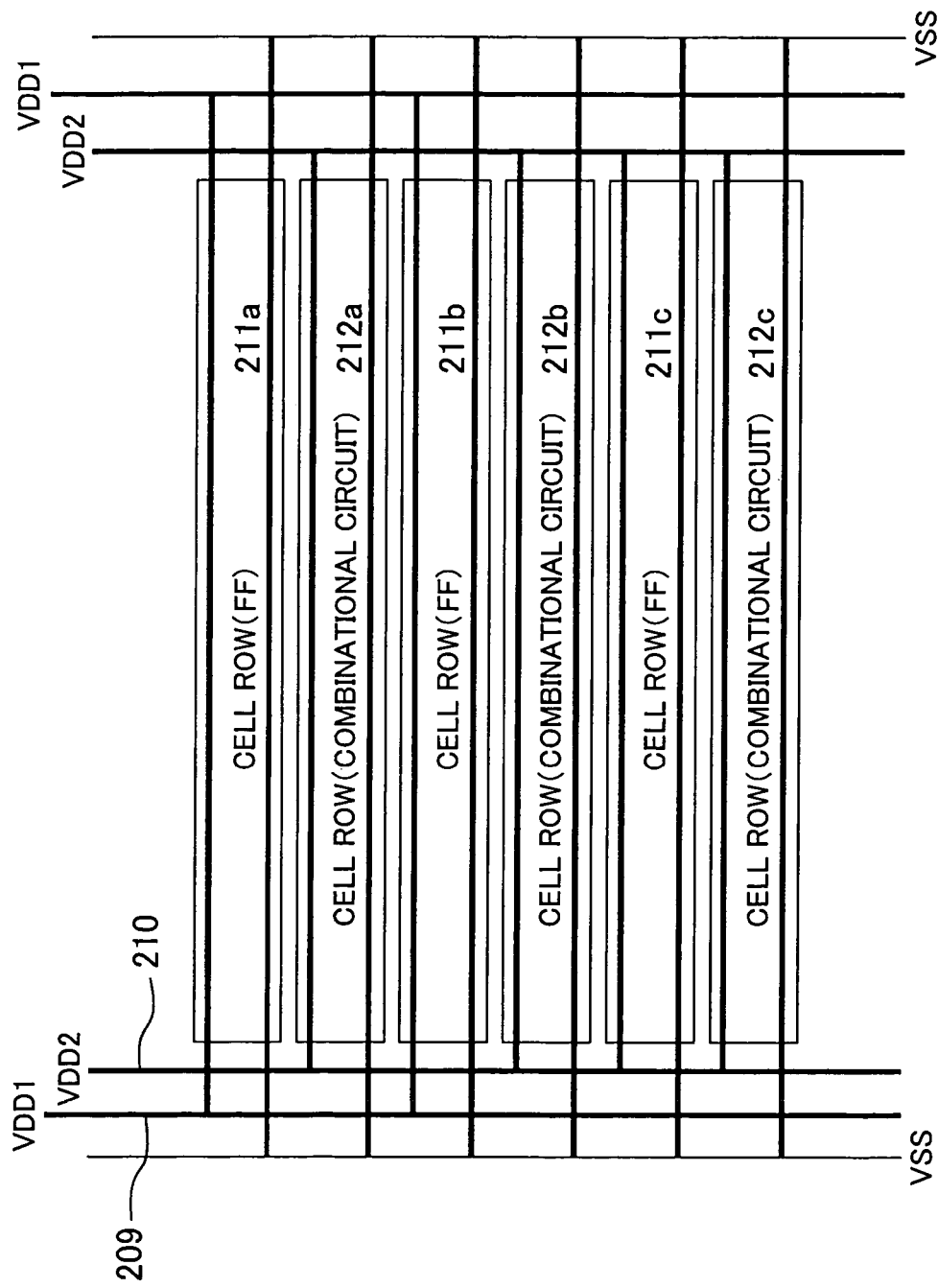
FIG. 11 is a layout block diagram of the semiconductor integrated circuit of the first embodiment of the present invention.

FIG. 11 illustrates an exemplary layout block diagram of the semiconductor integrated circuit of the first embodiment of the present invention. In FIG. 11, the reference numerals 211a to 211c denote cell rows (first regions), in each of which a plurality of flip-flop-circuit standard cells (indicated by the character FF in FIG. 11) are arranged in a row in the horizontal direction in the figure. The reference numerals 212a to 212c also indicate cell rows (second regions), in each of which a plurality of combinational-circuit standard cells are arranged in a row in the horizontal direction in the figure. The cell rows 211a to 211c of the flip-flop-circuit standard cells and the cell rows 212a to 212c of the combinational-circuit standard cells are alternately arranged in the vertical direction in the figure. The reference numeral 209 represents metal power source wiring (first power source wiring) for supplying power supply voltage to the cell rows 211a to 211c of the flip-flop-circuit standard cells, while the reference numeral 210 indicates metal power source wiring (second power source wiring) for supplying power supply voltage to the cell rows 212a to 212c of the combinational-circuit standard cells.

The configuration of FIG. 11 facilitates the layout design of the semiconductor integrated circuit in which the power source wiring for the flip flop circuits and the power source wiring for the combinational circuits are separate from each other.

SECOND EMBODIMENT

Next, a semiconductor integrated circuit and a method for testing the same according to a second embodiment of the present invention will be described.

Figure 12:
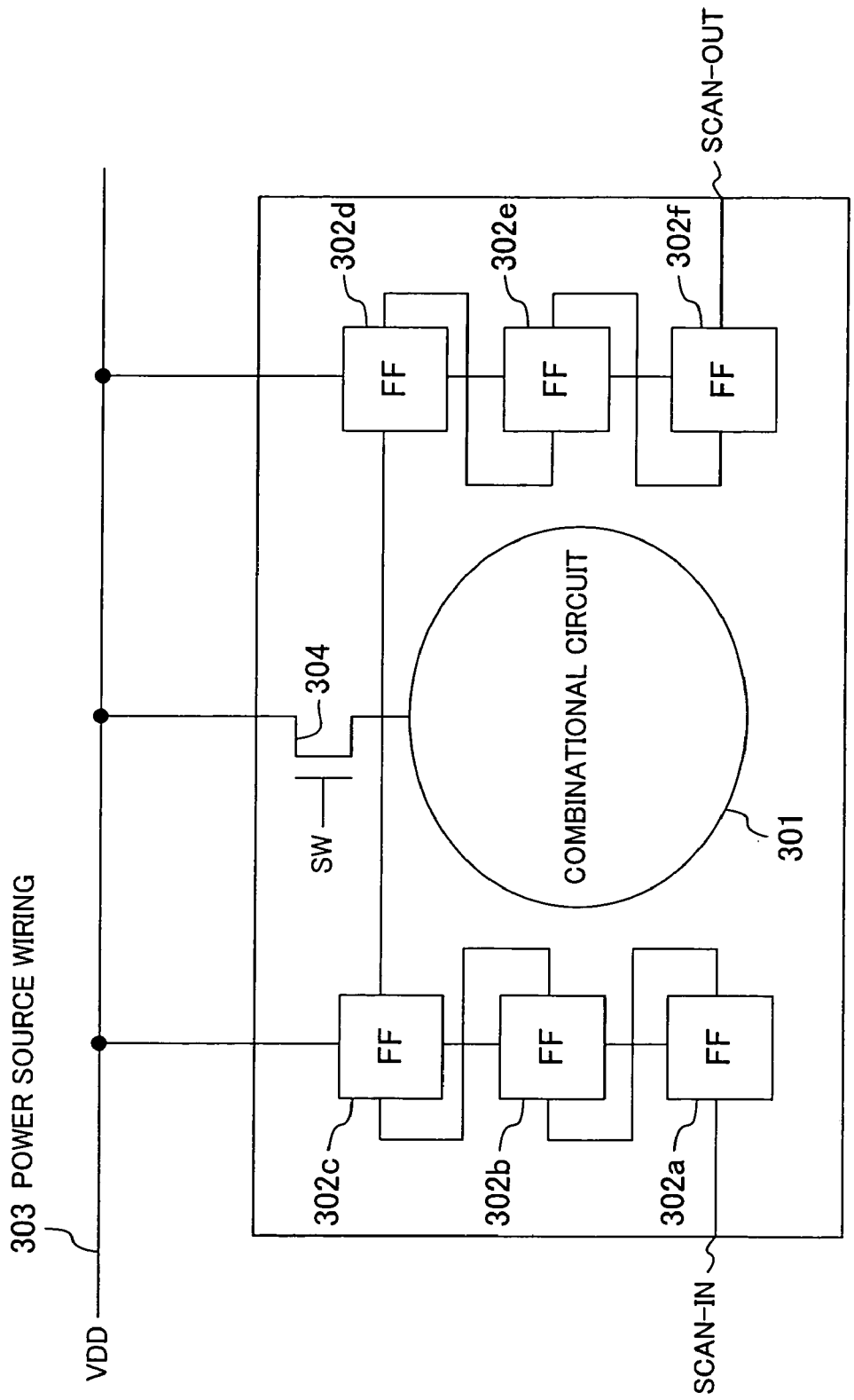
FIG. 12 illustrates a semiconductor integrated circuit according to a second embodiment of the present invention.

FIG. 12 is a circuit diagram illustrating the configuration of the semiconductor integrated circuit according to the second embodiment. In FIG. 12, the reference numeral 301 denotes a combinational circuit. The reference numerals 302a to 302f represent flip flop circuits. The reference numeral 303 refers to power source wiring for supplying power supply voltage VDD to the combinational circuit 301 and the flip flop circuits 302a to 302f. The reference numeral 304 refers to an N-type transistor switch (power source cut-off circuit) for cutting off the supply of the power supply voltage to the combinational circuit 301. When a logical value of 1 is applied to a gate signal SW, the transistor switch 304 is turned on, and when a logical value of 0 is applied to the gate signal SW, the transistor switch 304 is turned off. While the transistor switch 304 is on, the power supply voltage VDD is supplied. While the transistor switch 304 is off, the power supply is cut off. In the metal power source wiring 303 that supplies the power supply voltage to the combinational circuit 301, the transistor switch 304 may be disposed in a portion located before the branch point at which the metal power source wiring 303 branches into the combinational circuit 301. Alternatively, the transistor switch 304 may be individually disposed within each cell of the combinational circuit 301.

The configuration mentioned above makes it possible to independently cut off the power supply voltage applied to the combinational circuit 301, thereby reducing the power consumed when the combinational circuit 301 performs unnecessary operation.

The above-mentioned advantage can be obtained in shift operation in scan testing, for example. The flip flop circuits 302a to 302f shown in FIG. 12 form a scan chain during shift operation in scan testing. During shift operation in scan testing, the combinational circuit 301 portion unnecessarily consumes power as described above.

Figure 13:
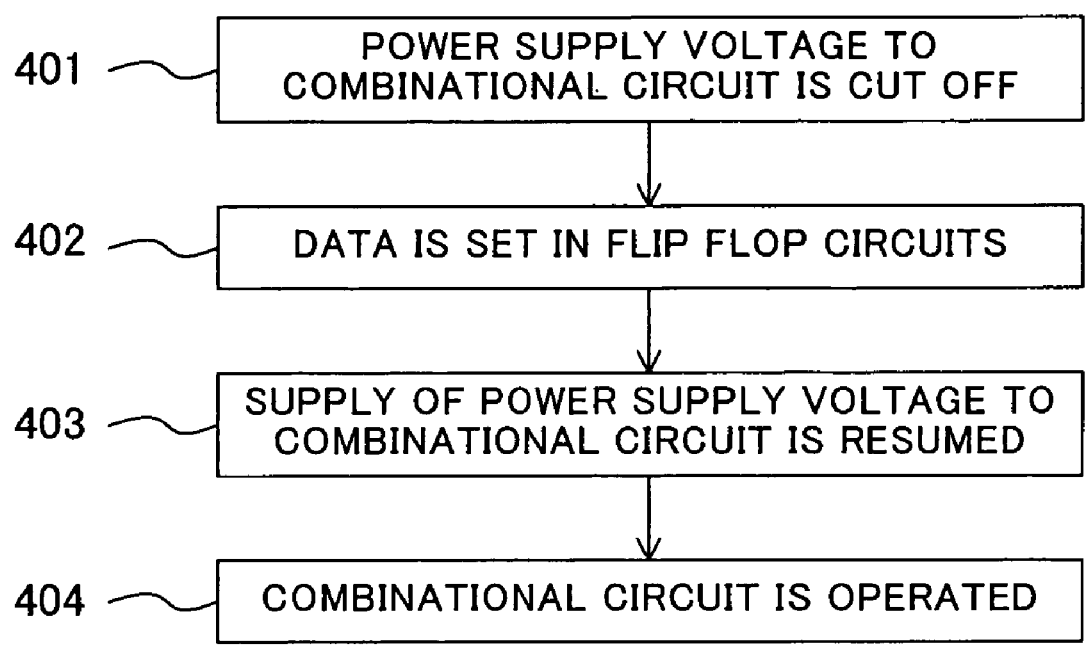
FIG. 13 indicates a method for testing the semiconductor integrated circuit of the second embodiment of the present invention.

FIG. 13 indicates a test method in which the above-mentioned advantage of the semiconductor integrated circuit of FIG. 12 is utilized. The test method shown in FIG. 13 includes four steps 401 to 404. In the first step 401, the power supply voltage VDD to the combinational circuit 301 is cut off. In the second step 402, test data is set in the flip flop circuits 302a to 302f. In the third step 403, the supply of the power supply voltage VDD to the combinational circuit 301 is resumed. In the fourth step 404, the combinational circuit 301 is operated.

Figure 14:
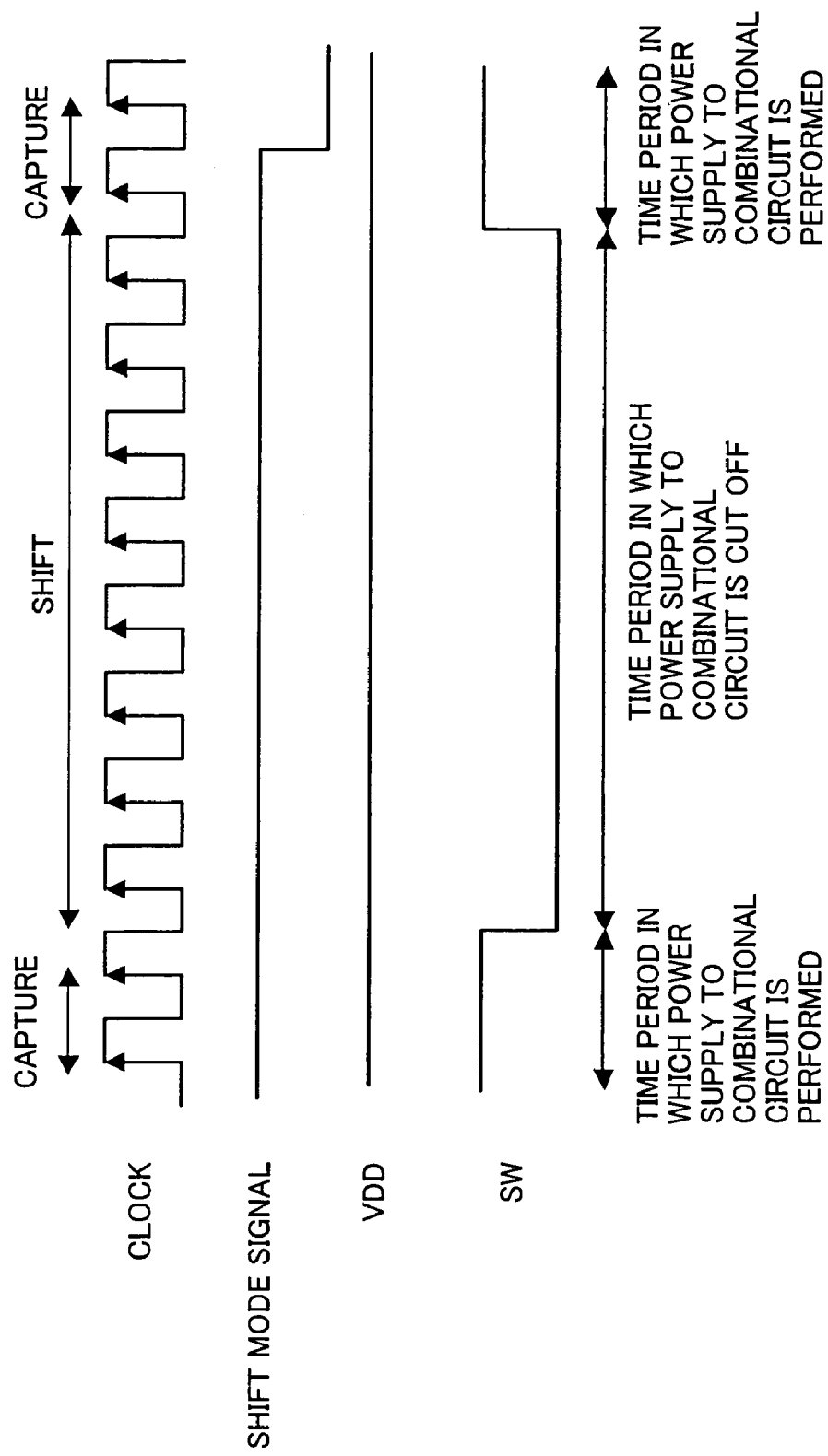
FIG. 14 is a time chart indicating the test method of FIG. 13.

A scan test conducted in the semiconductor integrated circuit of FIG. 12 in accordance with the method of FIG. 13 is shown in a time chart in FIG. 14. First, the gate signal SW1 is switched to 0 to turn off the transistor switch 304, thereby cutting off the power supply to the combinational circuit 301. Test data is then set in the flip flop circuits 302a to 302f by shift operation. Thereafter, the gate signal SW1 is switched to 1 to turn on the transistor switch 304, thereby resuming the power supply to the combinational circuit 301. The test conditions are then satisfied, and the combinational circuit 310 is operated by capture operation. These steps are repeated a certain number of times to complete the scan test.

First Modified Example of the Second Embodiment

The semiconductor integrated circuit of the second embodiment may be provided with a counter for measuring a certain period of time required for voltage newly selected in the power supply voltage switching step in FIG. 13 to become stable, and a circuit for stopping supply of a clock signal to the flip flop circuits during that time period.

Figure 15:
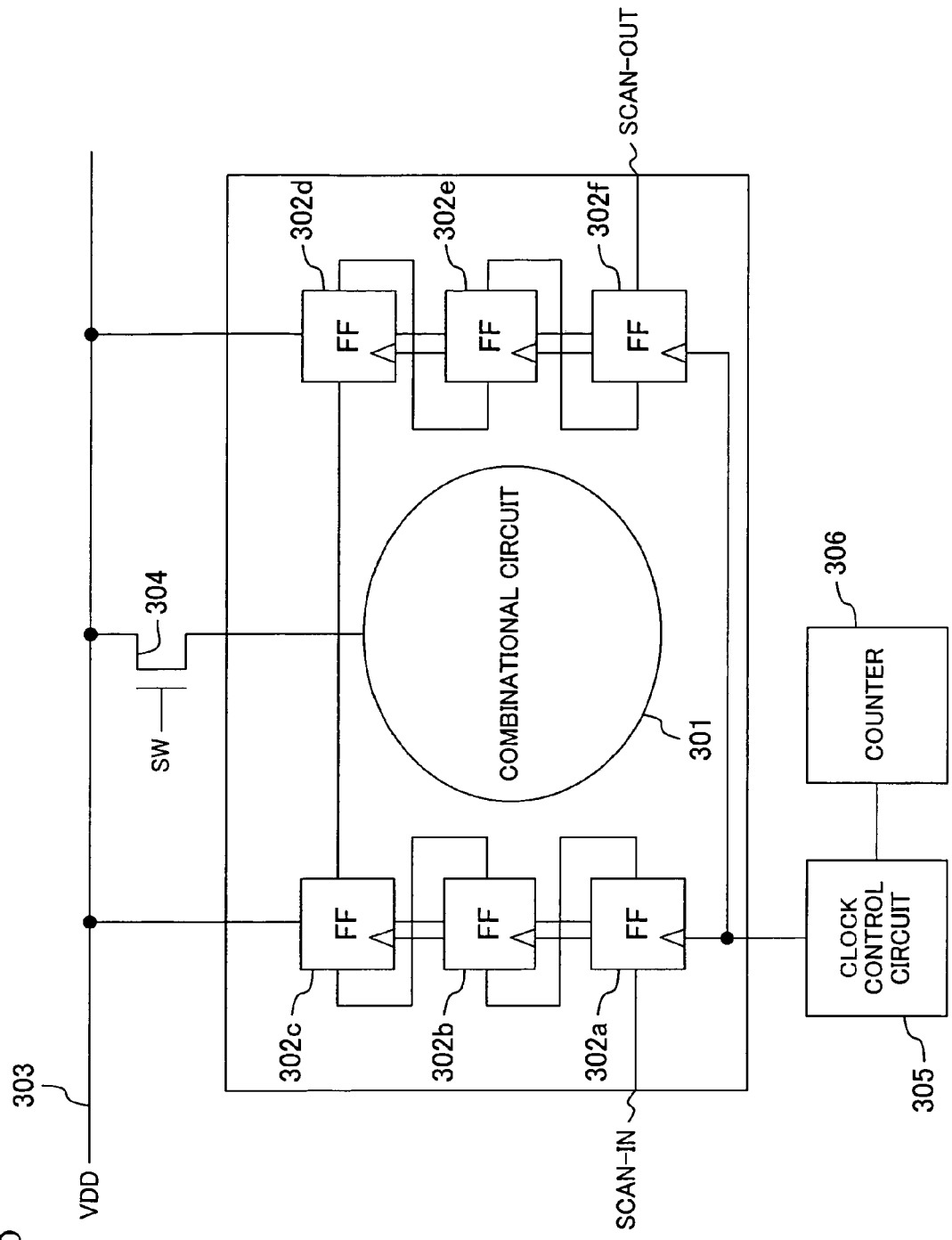
FIG. 15 illustrates a semiconductor integrated circuit which includes a clock control circuit and a counter according to a first modified example of the second embodiment of the present invention.
Figure 16:
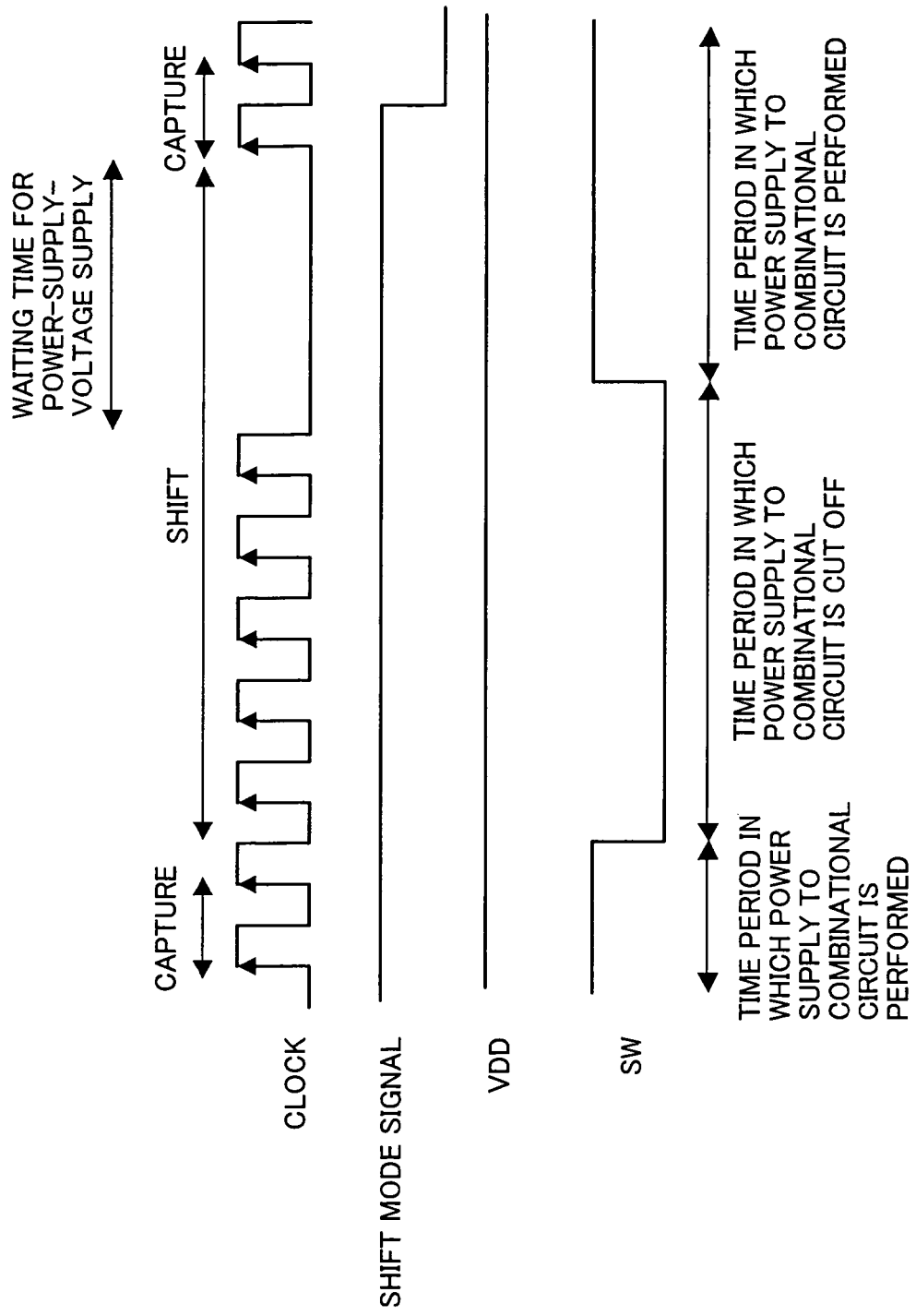
FIG. 16 is a time chart indicating a method for testing the semiconductor integrated circuit of the first modified example of the second embodiment of the present invention.

FIG. 15 illustrates a semiconductor integrated circuit which includes such a counter and a clock control circuit. In FIG. 15, the reference numeral 305 denotes the clock control circuit, while the reference numeral 306 refers to the counter. The clock control circuit 305 and the counter 306 are respectively the same as the clock control circuit 107 and the counter 108 shown in FIG. 9. Therefore, during the time period measured by the counter 306, the supply of a clock signal to the flip flop circuits is stopped, causing the semiconductor integrated circuit to stop its operation. During this stop period, the supply of the power supply voltage VDD is resumed. FIG. 16 is a time chart indicating a case in which the supply of a clock signal to the flip flop circuits is stopped during a certain period of time after the supply of the power supply voltage VDD is resumed. The time period in which the supply of a clock signal is stopped is a time period required for the newly selected power supply voltage to become stable.

Figure 17:
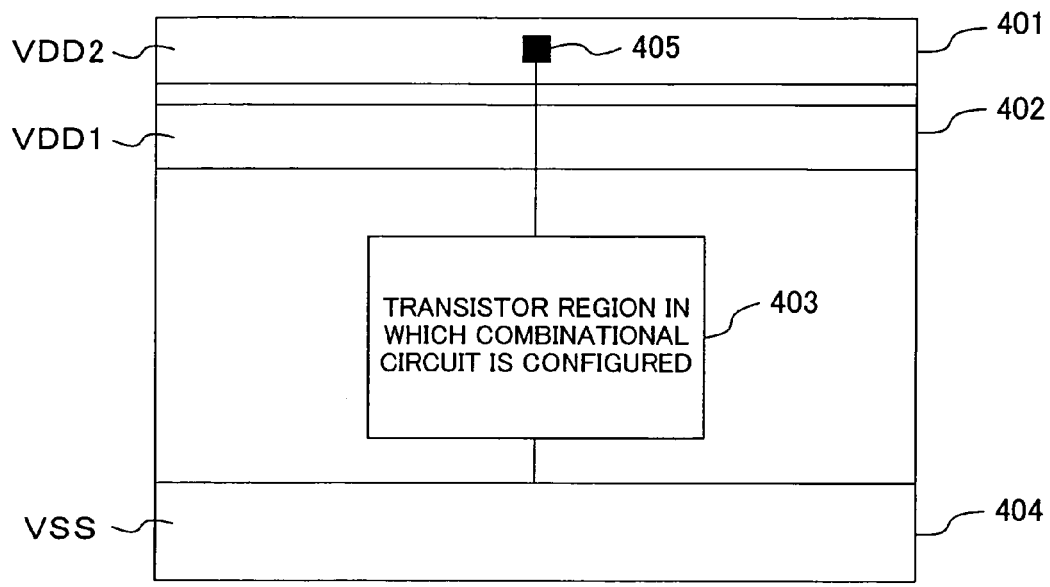
FIG. 17 illustrates a combinational-circuit standard cell included in the semiconductor integrated circuit of the first modified example of the second embodiment of the present invention.
Figure 18:
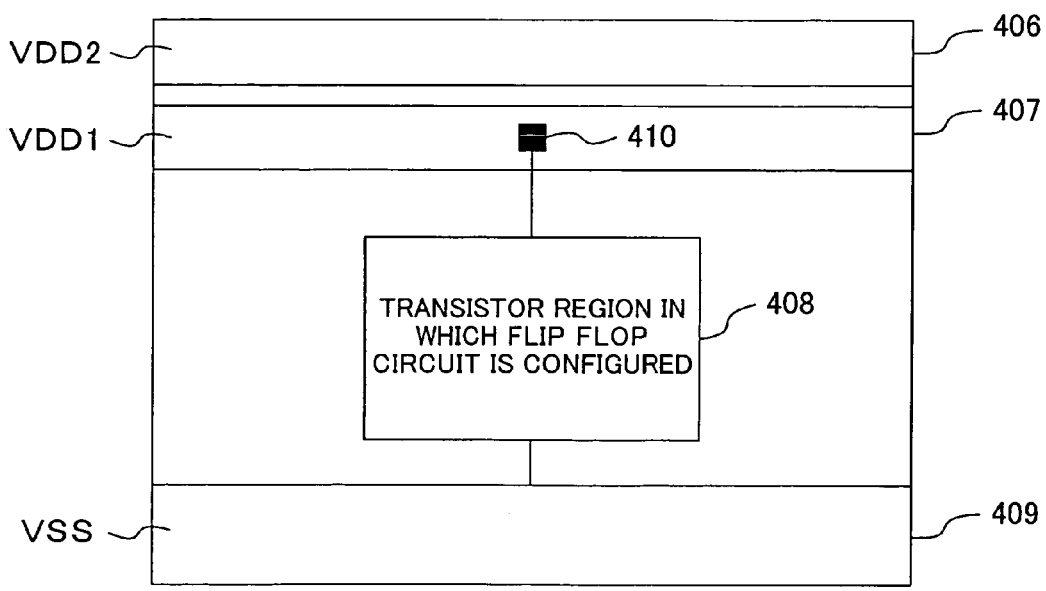
FIG. 18 illustrates a flip-flop-circuit standard cell included in the semiconductor integrated circuit of the first modified example of the second embodiment of the present invention.

FIG. 17 illustrates a standard cell (combinational-circuit standard cell) in which the combinational circuit in the semiconductor integrated circuit of the second embodiment of the present invention is configured, and FIG. 18 illustrates a standard cell (flip-flop-circuit standard cell) in which a flip flop circuit in the semiconductor integrated circuit of the second embodiment of the present invention is configured.

In the combinational-circuit standard cell 411 shown in FIG. 17, the reference numeral 403 denotes a transistor region (first region), in which the combinational circuit is configured. In the flip-flop-circuit standard cell 412 shown in FIG. 18, the reference numeral 408 refers to a transistor region (second region), in which the flip flop circuit is configured. Further, in the standard cells 411 and 412, a pair of metal power source wirings (401 and 402) and a pair of metal power source wirings (406 and 407), which extend horizontally, are disposed, respectively. In the flip-flop-circuit standard cell 412 shown in FIG. 18, the lower metal power source wiring (first power source wiring) 407 supplies power supply voltage VDD1 to the transistor region 408, in which the flip flop circuit is configured, and a contact 410 is used to connect the lower metal power source wiring 407 with the flip flop circuit in the transistor region 408. On the other hand, in the combinational-circuit standard cell 411 shown in FIG. 17, the upper metal power source wiring (second power source wiring) 401 supplies power supply voltage VDD2 to the transistor region 403, in which the combinational circuit is configured, and a contact 405 is used to connect the upper metal power source wiring 401 with the combinational circuit in the transistor region 403.

In the combinational-circuit standard cell 411 shown in FIG. 17, the lower metal power source wiring (first power source wiring) 402, which is connected to the corresponding metal power source wirings in the adjacent standard cells placed to the right and left of the standard cell 411, is used to supply the power supply voltage VDD1 to the associated flip flop circuits and is separate from the upper metal power source wiring 401. The reference numeral 404 denotes a grounding metal power source wiring.

Similarly, in the flip-flop-circuit standard cell 412 shown in FIG. 18, the upper metal power source wiring (second power source wiring) 406, which is connected to the corresponding metal power source wirings in the adjacent standard cells placed to the right and left of the standard cell 412, is used to supply the power supply voltage VDD2 to the associated combinational circuits and is separate from the lower metal power source wiring 407. The reference numeral 409 denotes a grounding metal power source wiring.

As shown in FIGS. 17 and 18, the two power-supply-voltage-supplying metal power source wirings 401 and 402 extend in the horizontal direction in parallel with each other in the upper portion of the standard cell 411, and the two power-supply-voltage-supplying metal power source wirings 406 and 407 extend in the horizontal direction in parallel with each other in the upper portion of the standard cell 412. The power supply voltages VDD2 and VDD1 are respectively supplied to the transistor regions 403 and 408 within the standard cells shown in FIGS. 17 and 18 from the respective metal power source wirings 401 and 407 through the respective contacts 405 and 410. The metal power source wirings 402 and 406 within the standard cells 411 and 412, which are not used to supply the power supply voltages VDD2 and VDD1 to the combinational circuit and the flip flop circuit, respectively, are each connected to the corresponding metal power source wirings in the adjacent standard cells placed to the right and left of the standard cell thereof. Therefore, the power supply voltage to the combinational circuit and the power supply voltage to the flip flop circuit can be provided independently of each other.

Figure 19:
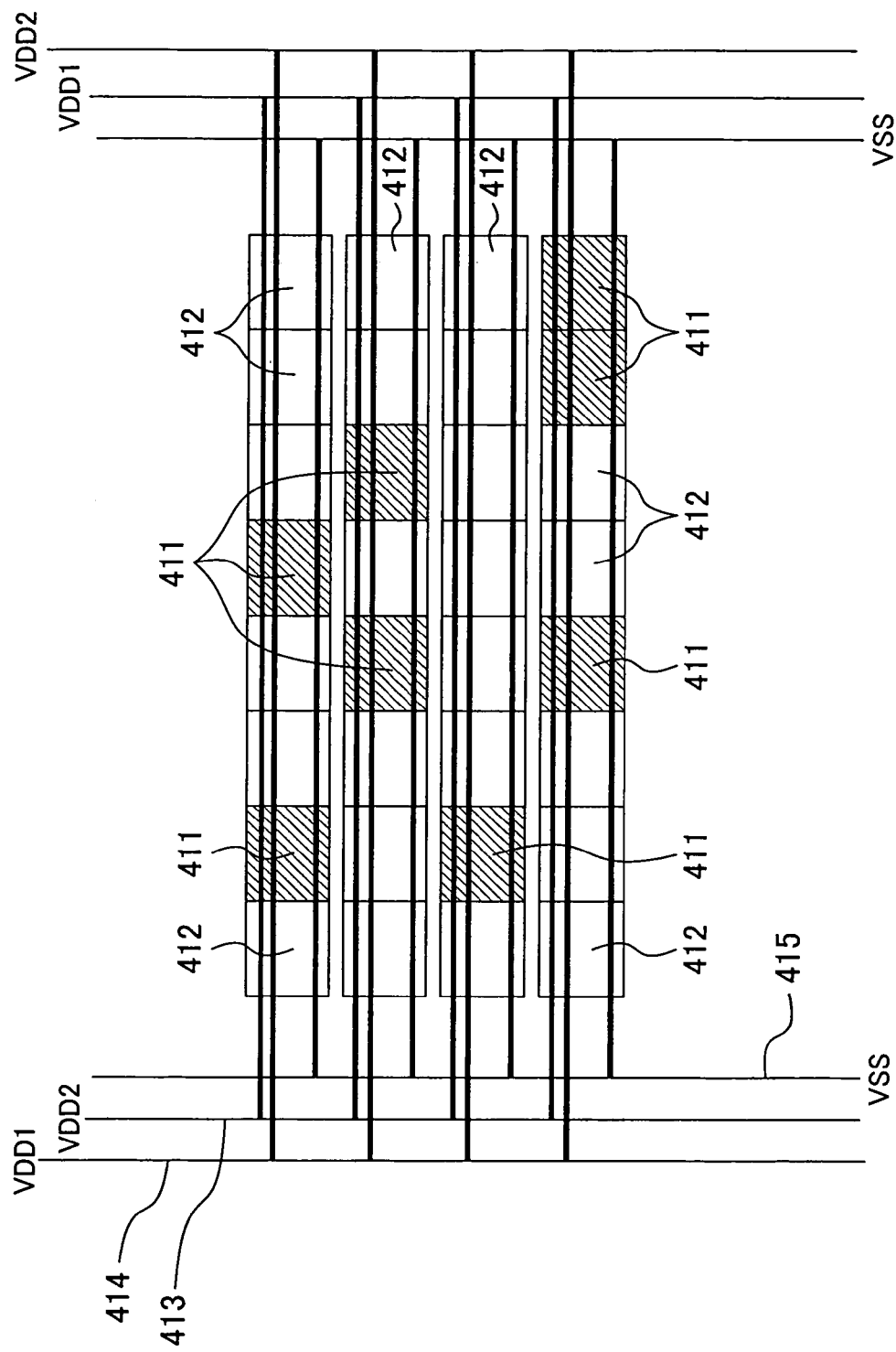
FIG. 19 is a layout block diagram of the semiconductor integrated circuit of the second embodiment of the present invention.

FIG. 19 is a layout block diagram of the semiconductor integrated circuit of the second embodiment of the present invention, in which the standard cell shown in FIG. 17 is used for each combinational circuit and the standard cell shown in FIG. 18 is used for each flip flop circuit. In FIG. 19, the reference numeral 411 denotes the combinational-circuit standard cell shown in FIG. 17, while the reference numeral 412 refers to the flip-flop-circuit standard cell shown in FIG. 18. The reference numeral 413 represents metal power source wiring for supplying the power supply voltage VDD2 to the combinational circuits, while the reference numeral 414 indicates metal power source wiring for supplying the power supply voltage VDD1 to the flip flop circuits. The reference numeral 415 represents grounding metal power source wiring. By cutting off the power supply provided from the power source wiring 413, only the power supply to the combinational circuits can be cut off.

In this embodiment, the layout design that enables only the power supply to the combinational circuits to be cut off is facilitated without imposing any restrictions on the locations of the flip-flop-circuit cells and combinational-circuit cells.

THIRD EMBODIMENT

Next, a semiconductor integrated circuit and a method for testing the same according to a third embodiment of the present invention will be described.

Figure 20:
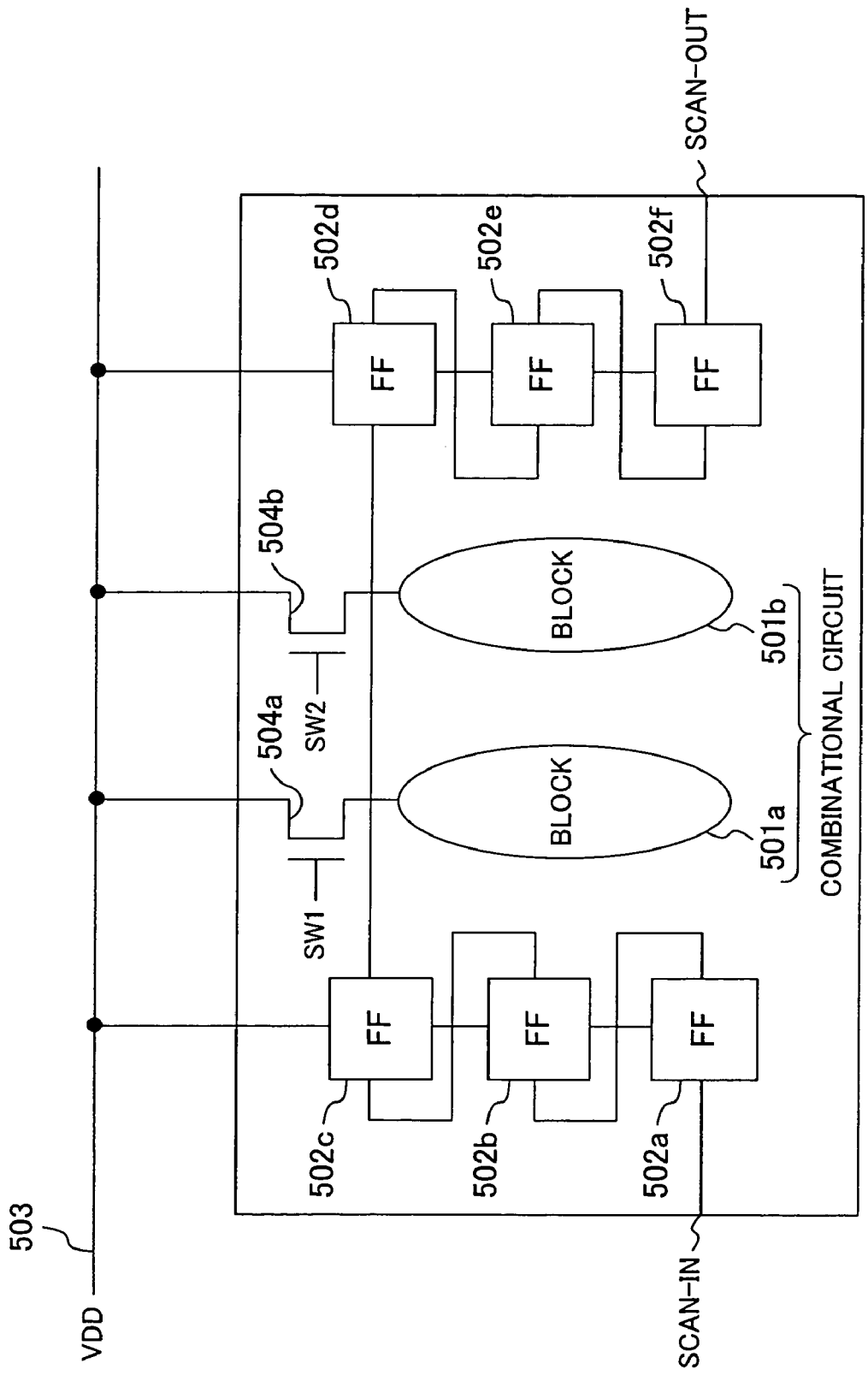
FIG. 20 illustrates a semiconductor integrated circuit according to a third embodiment of the present invention.

FIG. 20 is a circuit diagram indicating the configuration of the semiconductor integrated circuit according to the third embodiment of the present invention. In FIG. 20, the reference numeral 501 denotes a combinational circuit, which is divided into a plurality of blocks (two blocks in FIG. 20) 501a and 501b. The reference numerals 502a to 502f represent flip flop circuits. The reference numeral 503 refers to power source wiring for supplying power supply voltage VDD.

In FIG. 20, the reference numeral 504a refers to a transistor switch for cutting off the supply of the power supply voltage to the block 501a, while the reference numeral 504b refers to a transistor switch for cutting off the supply of the power supply voltage to the block 501b. When a logical value of 1 is applied to a gate signal SW1, the transistor switch 504a turns on, and when a logical value of 0 is applied to the gate signal SW1, the transistor switch 504a turns off. When a logical value of 1 is applied to a gate signal SW2, the transistor switch 504b turns on, and when a logical value of 0 is applied to the gate signal SW2, the transistor switch 504b turns off. Each of the transistor switches 504a and 504b is supplied with the power supply voltage while the transistor switch is on, and the power supply thereto is cut off while the transistor is off. In the metal power source wiring that provides the power supply to the blocks 501a and 501b, the transistor switches 504a and 504b may be respectively disposed in portions located before the respective branch points at which the metal power source wiring branches into the blocks 501a and 501b. Alternatively, the transistor switch 504a or 504b may be individually disposed within each cell of the combinational circuit.

In the configuration mentioned above, the power supply voltage VDD applied to the block 501a and the power supply voltage VDD applied to the block 501b can be cut off independently of each other, thereby reducing the amount of power consumed when either the block 501a or 501b performs unnecessary operation. In addition, since it is possible to independently cut off and resume the supply of the power supply voltage VDD to each of the blocks 501a and 501b, the transistor switches 504a and 504b can be controlled so as to prevent a momentary change in the power supply voltage VDD in the entire combinational circuit 501, whereby abnormal operation in the combinational circuit 501 can be avoided.

The above-mentioned advantage can be obtained during shift operation in scan testing, for example. The flip flop circuits 502a to 502f shown in FIG. 20 form a scan chain during shift operation in scan testing. During shift operation in scan testing, the combinational circuit portion unnecessarily consumes power as mentioned above.

Figure 21:
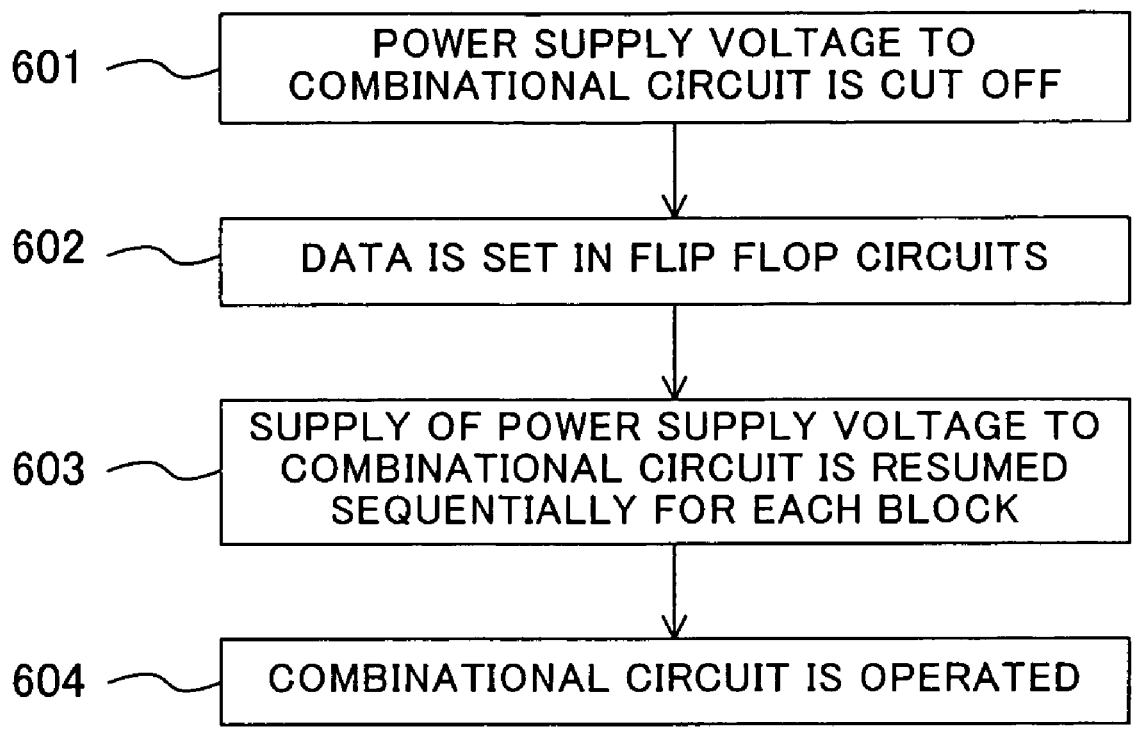
FIG. 21 indicates a method for testing the semiconductor integrated circuit of the third embodiment of the present invention.

FIG. 21 indicates a test method in which the above-mentioned advantage of the semiconductor integrated circuit of FIG. 20 is utilized. The test method shown in FIG. 21 includes four steps 601 to 604. In the first step 601, the power supply voltage to the combinational circuit 501 is cut off. In the second step 602, scan test data is set in the flip flop circuits. In the third step 603, the supply of the power supply voltage to the combinational circuit 501 is resumed sequentially for each of the blocks 501a and 501b. In the fourth step 604, the combinational circuit 501 is operated.

Figure 22:
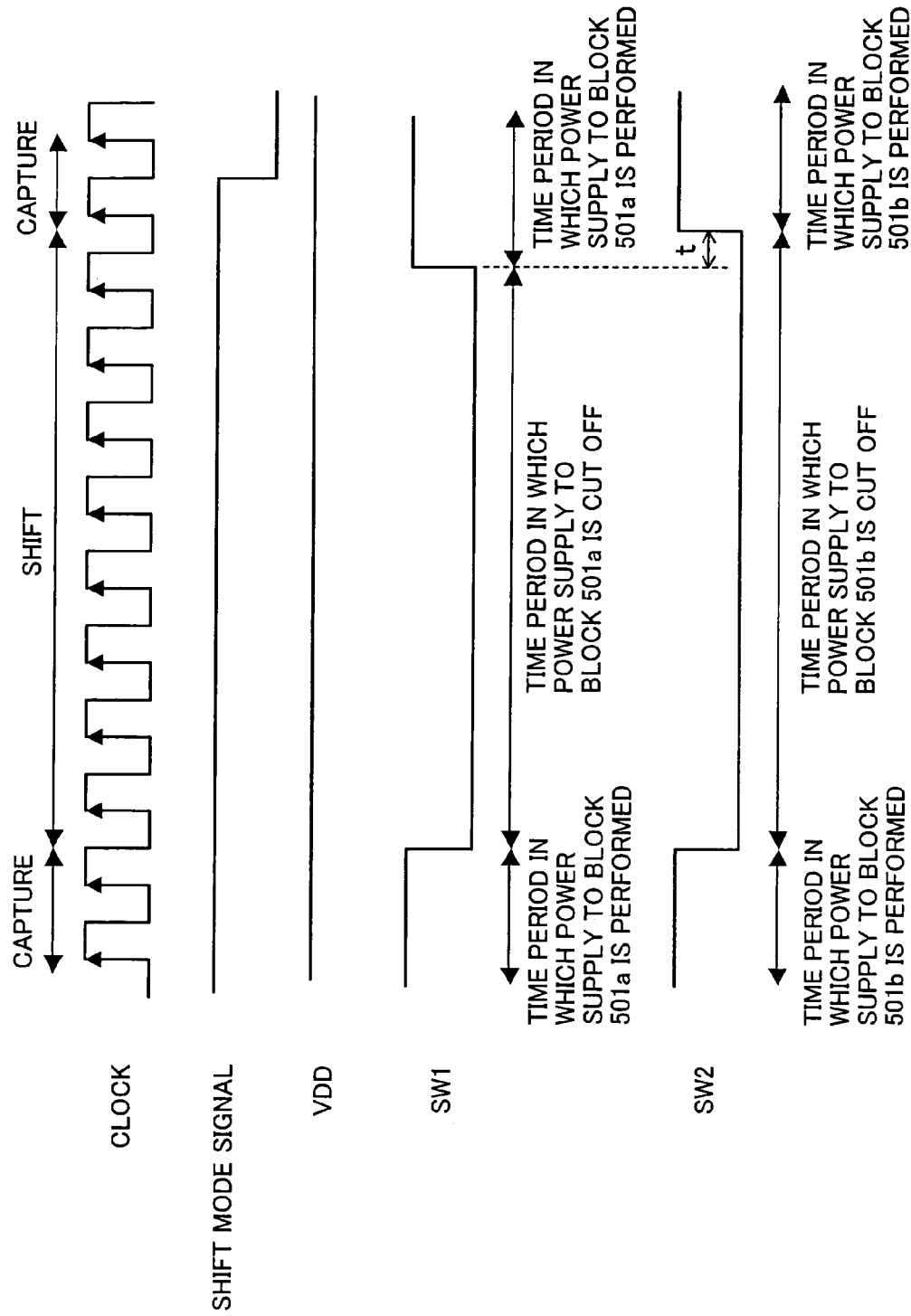
FIG. 22 is a time chart indicating the test method of FIG. 21.

A scan test conducted in the semiconductor integrated circuit of FIG. 20 in accordance with the method of FIG. 21 is shown in a time chart in FIG. 22. First, the gate signals SW1 and SW2 are both switched to 0 to turn off both the transistor switches 504a and 504b, thereby cutting off the power supply to the combinational circuit 501. Test data is then set in the flip flop circuits 502a to 502f by shift operation. Thereafter, the gate signals SW1 and SW2 are sequentially switched to 1 with a certain amount of time t elapsing between the switching of the signal SW1 and the switching of the signal SW2, thereby sequentially resuming the power supply to the blocks 501a and 501b. The test conditions are then satisfied, and the combinational circuit is operated by capture operation. These steps are repeated a certain number of times to complete the scan test.

First Modified Example of the Third Embodiment

The semiconductor integrated circuit of the third embodiment may be provided with a counter for measuring a certain period of time required for voltage newly selected in power-supply-voltage switching to become stable, and a circuit for stopping supply of a clock signal to the flip flop circuits.

Figure 23:
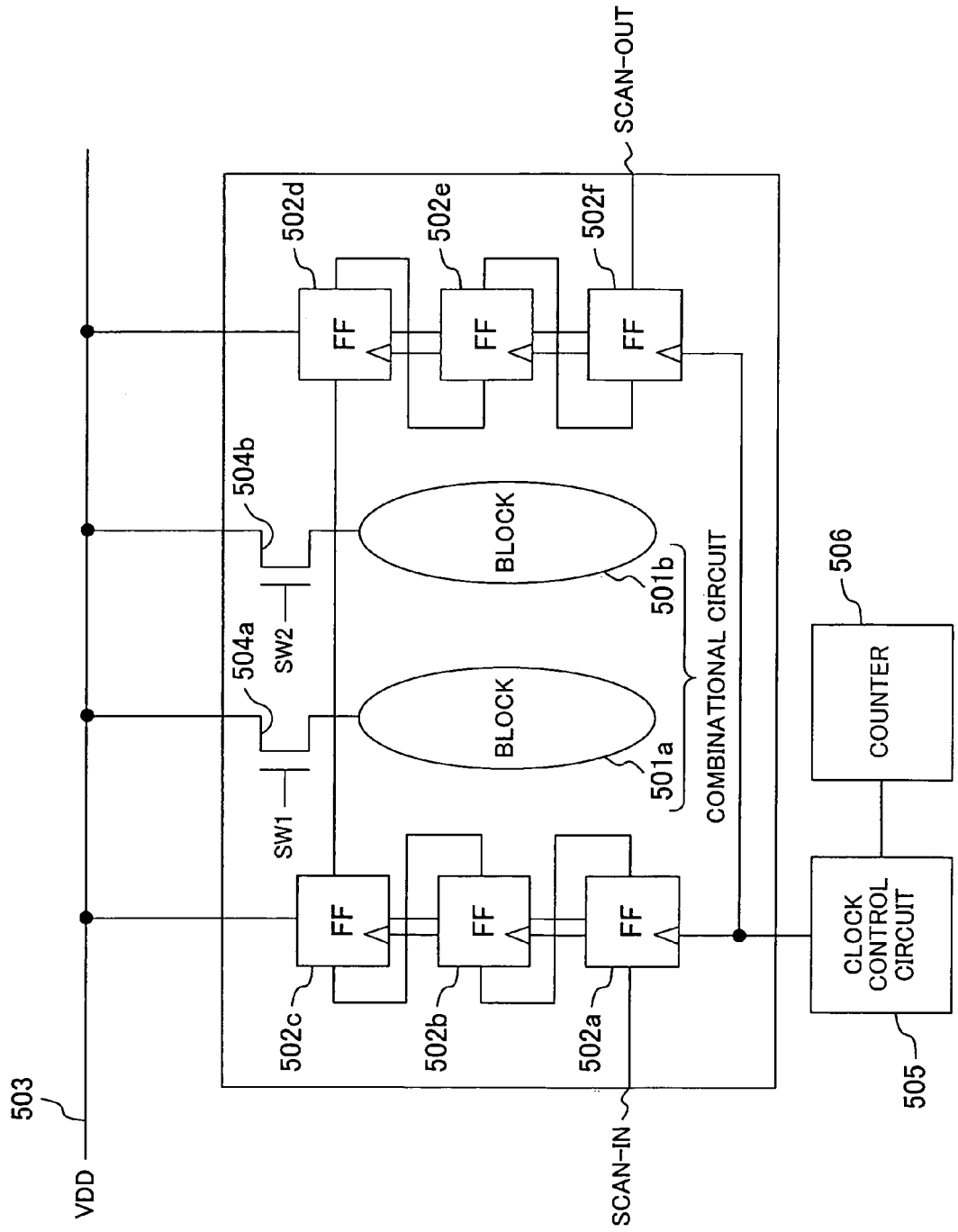
FIG. 23 illustrates a semiconductor integrated circuit which includes a clock control circuit and a counter according to a first modified example of the third embodiment of the present invention.

FIG. 23 illustrates a semiconductor integrated circuit which includes such a counter and a clock control circuit. In FIG. 23, the reference numeral 505 denotes the clock control circuit, while the reference numeral 506 refers to the counter. The clock control circuit 505 and the counter 506 are respectively the same as the clock control circuit 107 and the counter 108 shown in FIG. 9.

Figure 24:
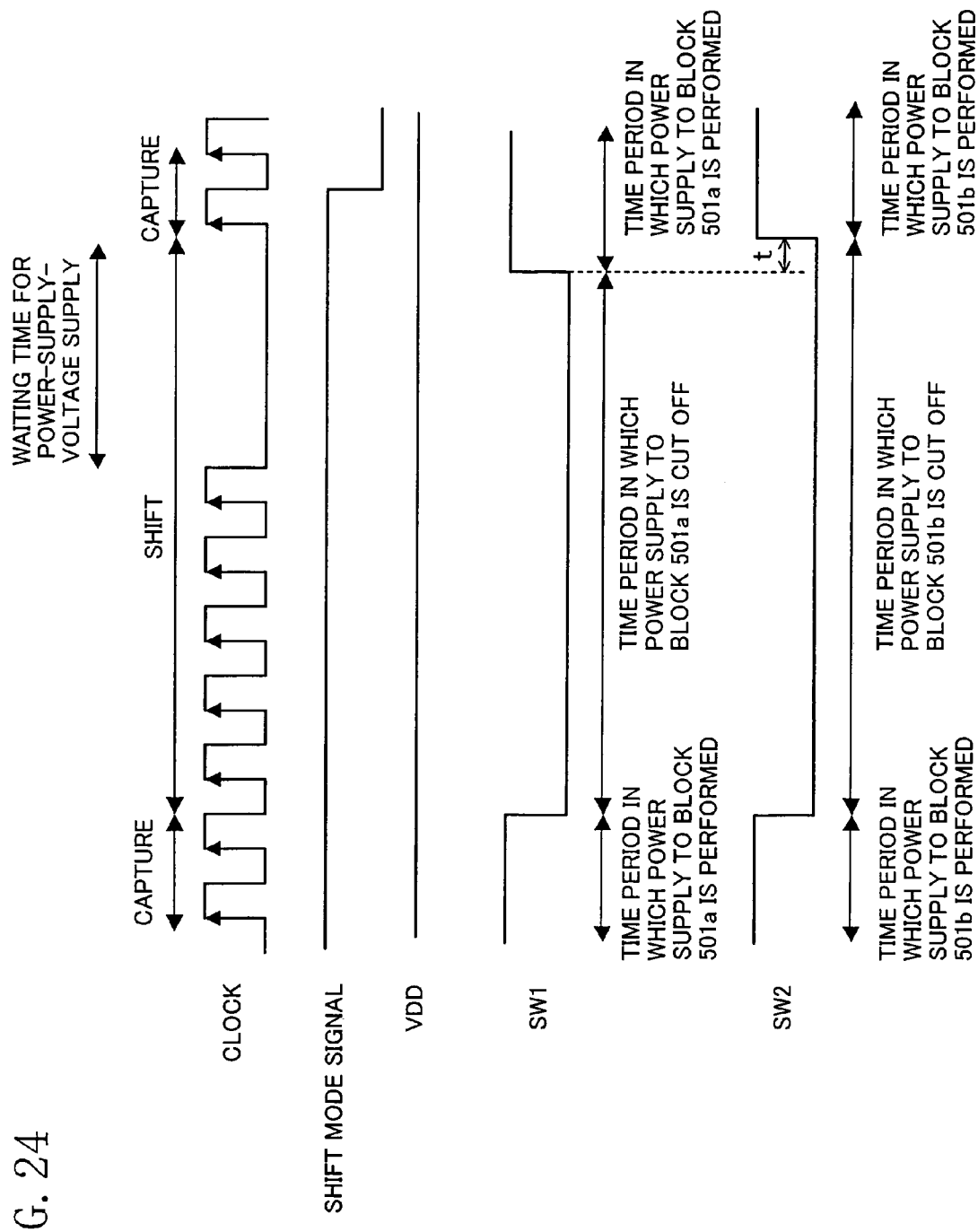
FIG. 24 is a time chart indicating a method for testing the semiconductor integrated circuit of the first modified example of the third embodiment of the present invention.

In the above-described configuration, the supply of a clock signal to the flip flop circuits is stopped during the certain time period, causing the semiconductor integrated circuit to stop its operation. In this stop period, the supply of the power supply voltage VDD is resumed. FIG. 24 is a time chart indicating a case in which the supply of a clock signal to the flip flop circuits is stopped during a certain period of time after the supply of the power supply voltage VDD is resumed. The time period in which the supply of the clock signal is stopped is a time period required for the newly selected power supply voltage to become stable.

Figure 25:
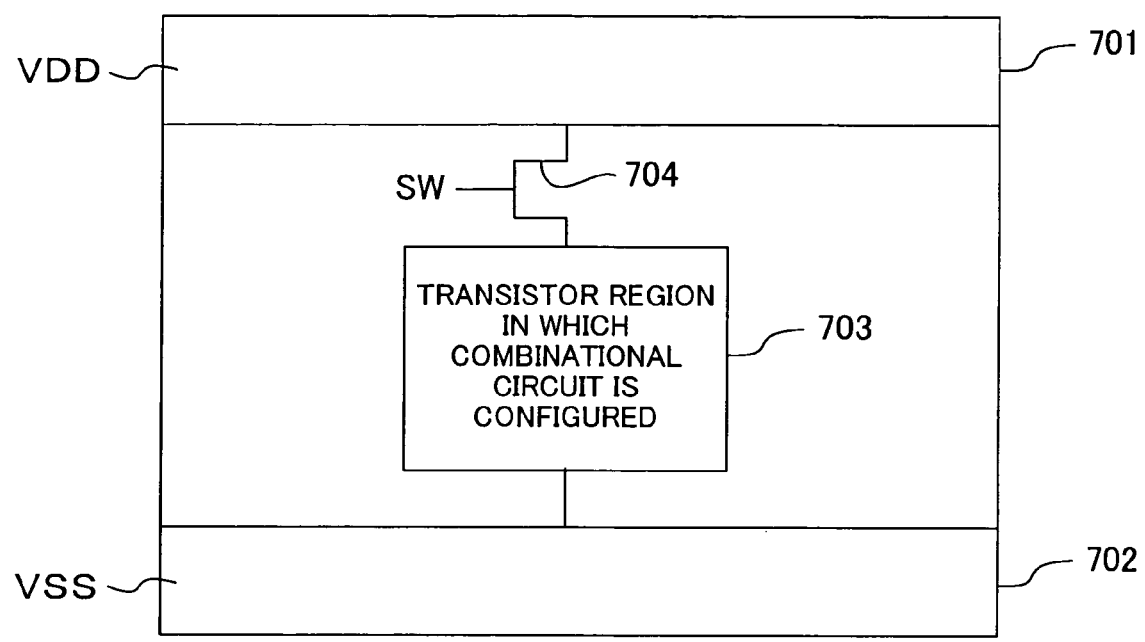
FIG. 25 illustrates a combinational-circuit standard cell included in the semiconductor integrated circuit of the first modified example of the third embodiment of the present invention.

FIG. 25 illustrates a combinational-circuit standard cell in the semiconductor integrated circuit of the third embodiment of the present invention, in which a transistor switch for cutting off power is disposed.

In FIG. 25, the reference numeral 701 denotes metal power source wiring for supplying power supply voltage VDD. The reference numeral 702 refers to grounding metal power source wiring. The reference numeral 703 represents a transistor region in which a combinational circuit is configured. The reference numeral 704 indicates a cutoff transistor (power source cut-off circuit) for cutting off the supply of the power supply voltage VDD from the metal power source wiring 701. When a gate signal SW, which is a signal used for switching, has a logical value of 1, the cutoff transistor 704 turns on to allow the power supply, and when the gate signal SW has a logical value of 0, the cutoff transistor 704 turns off to cut off the power supply.

Figure 26:
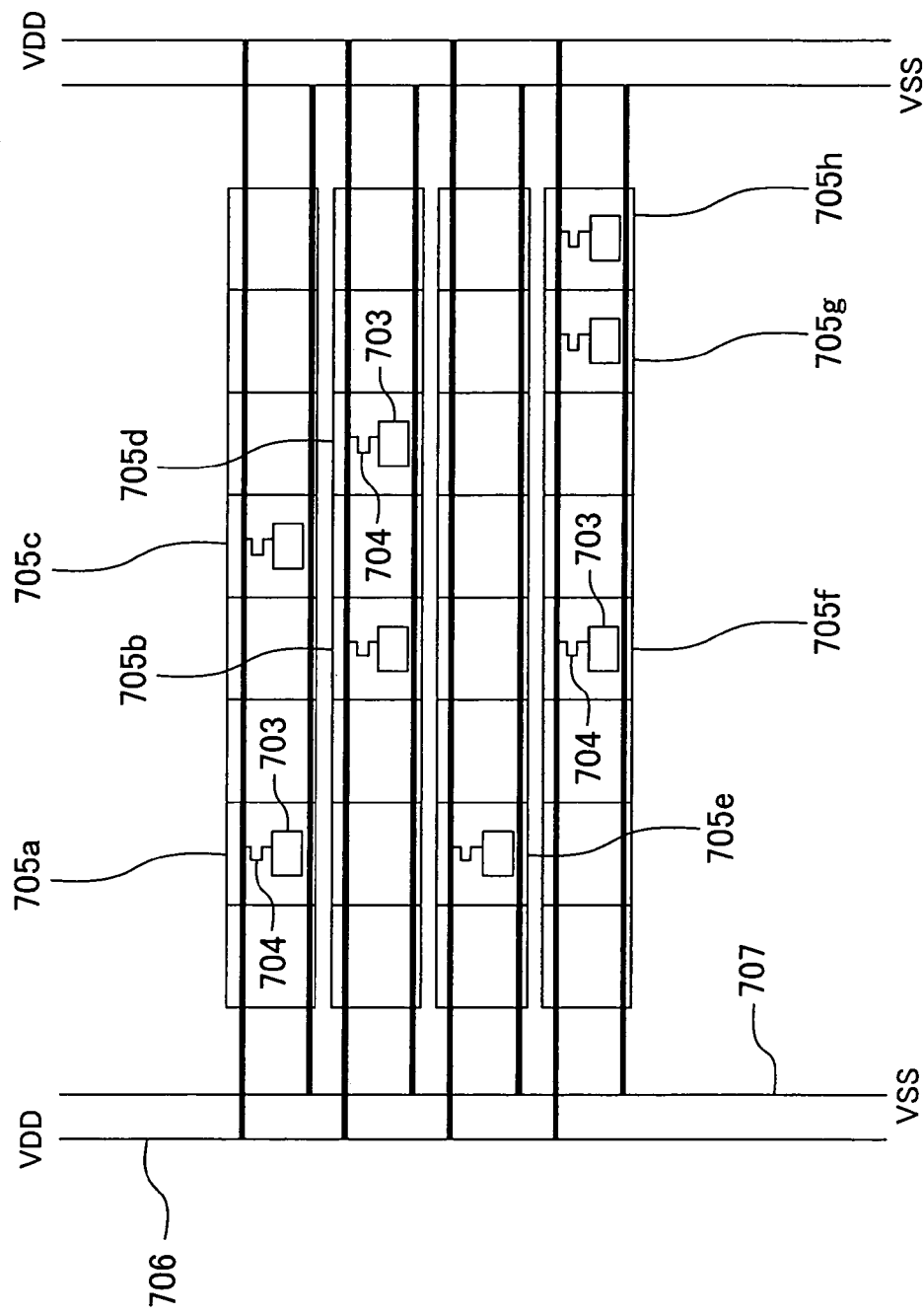
FIG. 26 is a layout block diagram of the semiconductor integrated circuit of the first modified example of the third embodiment of the present invention.

FIG. 26 is a layout block diagram of the semiconductor integrated circuit of the third embodiment shown in FIG. 23, in which the standard cell shown in FIG. 25 is used to configure each combinational circuit. In FIG. 26, the reference numerals 705a to 705h each denote the standard cell shown in FIG. 25. Each of the standard cells 705a to 705d forms the block 501a, while each of the standard cells 705e to 705h forms the block 501b. The reference numeral 706 represents metal power source wiring for providing power supply, while the reference numeral 707 indicates grounding metal power source wiring. By turning off the power-cutting-off transistor switches 704 in the standard cells 705a to 705d, only the power to the blocks 501a can be cut off. Also, by turning off the power-cutting-off transistor switches 704 in the standard cells 705e to 705h, only the power to the blocks 501b can be cut off.

Therefore, it is possible to independently control the power cutoff and the power supply for each of the blocks 501a and the blocks 501b. This circuit configuration facilitates the layout design of the semiconductor integrated circuit in which only the power to the combinational circuits can be cut off, without imposing any restrictions on the locations of the flip-flop-circuit cells and combinational-circuit cells.

FOURTH EMBODIMENT

Next, a semiconductor integrated circuit according to a fourth embodiment of the present invention will be described.

Figure 27:
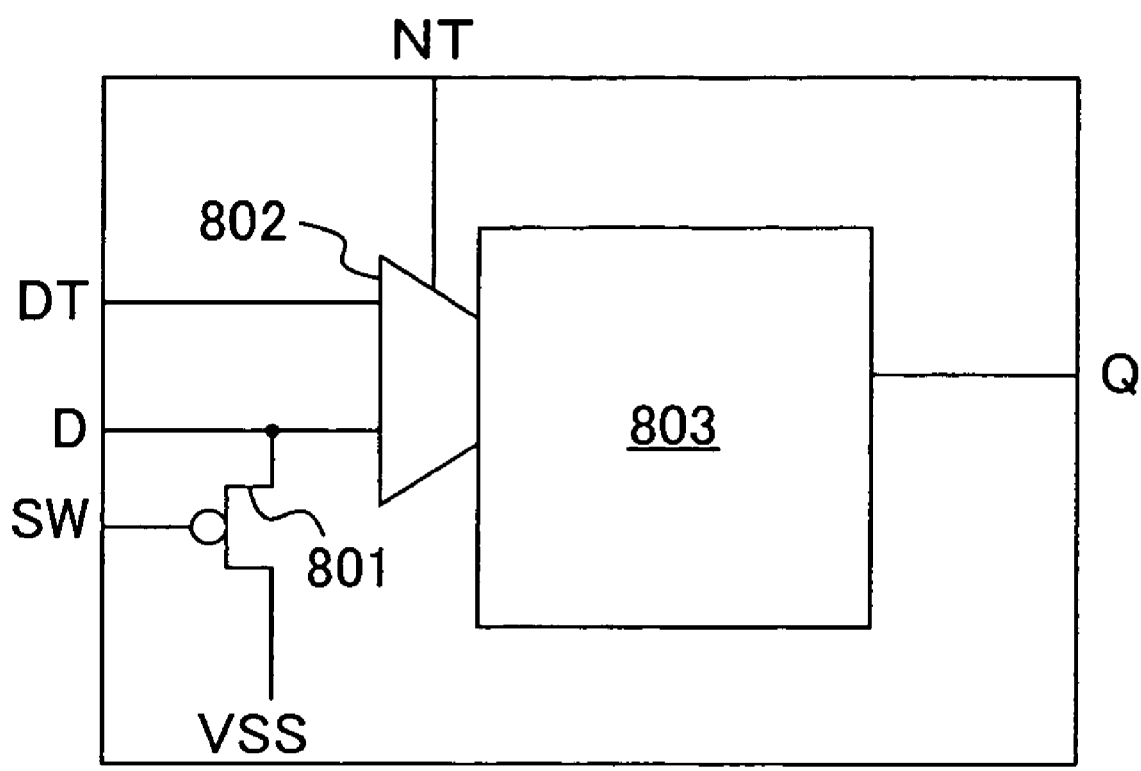
FIG. 27 illustrates a flip flop circuit in a semiconductor integrated circuit according to a fourth embodiment of the present invention.

FIG. 27 illustrates a flip flop circuit in the semiconductor integrated circuit according to the fourth embodiment. In FIG. 27, the reference character D denotes an input terminal for receiving a signal from a combinational circuit. The input terminal D is used during normal operation, during capture operation in scan testing, and the like. The reference character DT refers to an input terminal for receiving a signal from the scan chain. The input terminal DT is used during shift operation in scan testing. The reference character NT represents an input terminal for receiving a signal selecting either the value at the terminal D or the value at the terminal DT as input into the flip flop circuit. The reference character Q denotes the output terminal of the flip flop circuit. The reference numeral 801 represents a pull-down transistor (intermediate-potential prevention circuit) formed of a P-type transistor. When 0 is input into a gate signal SW, the pull-down transistor 801 turns on to pull down the potential of the input terminal D to ground potential VSS, thereby preventing the input terminal D from having an intermediate potential. On the other hand, when 1 is input into the gate signal SW, the transistor switch 801 turns off to cancel the pulling down of the potential to the ground potential VSS. The reference numeral 802 refers to a multiplexer, while the reference numeral 803 denotes a latch circuit.

Figure 28:
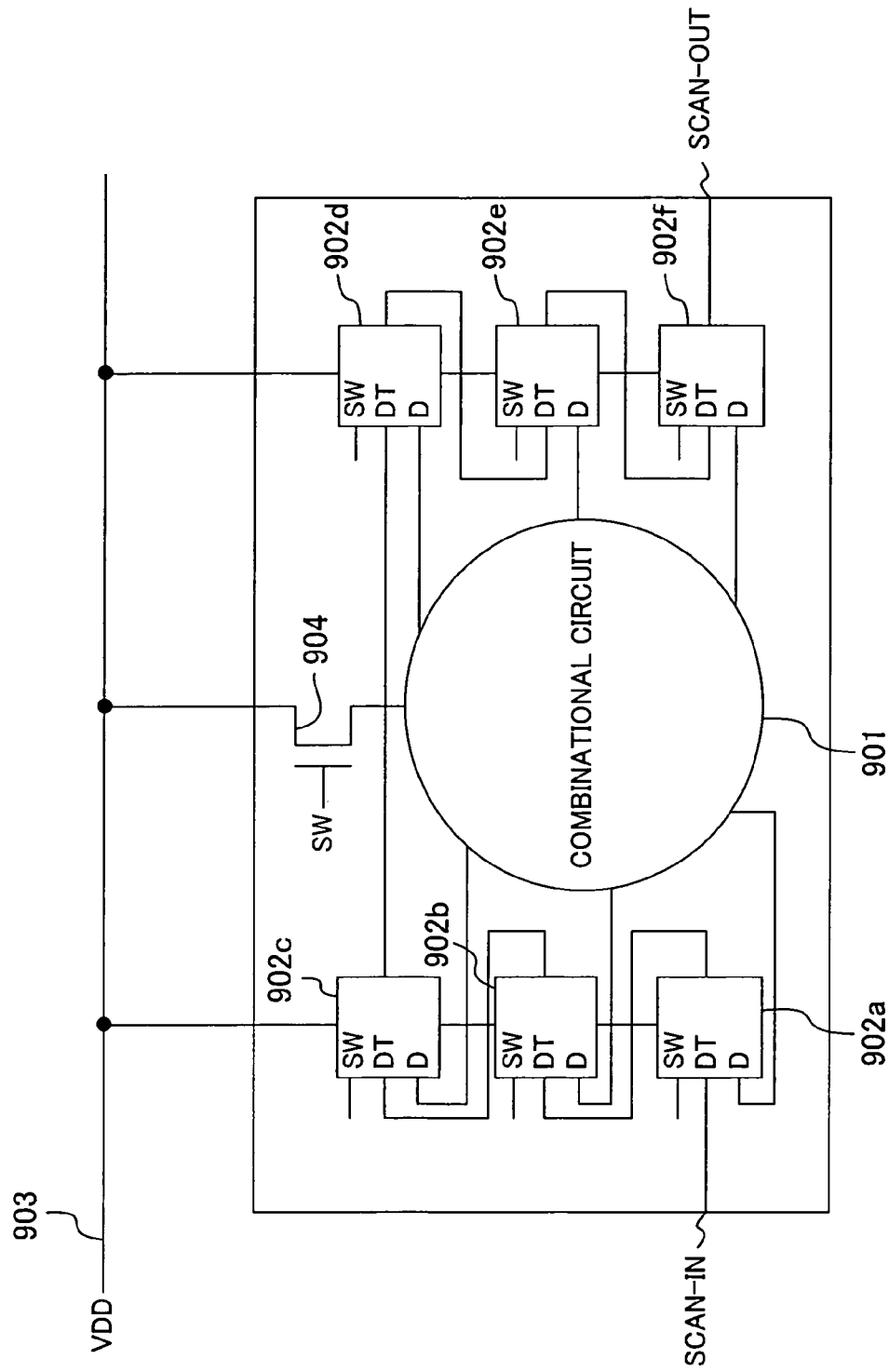
FIG. 28 illustrates the configuration of the semiconductor integrated circuit of the fourth embodiment of the present invention.
Figure 29:
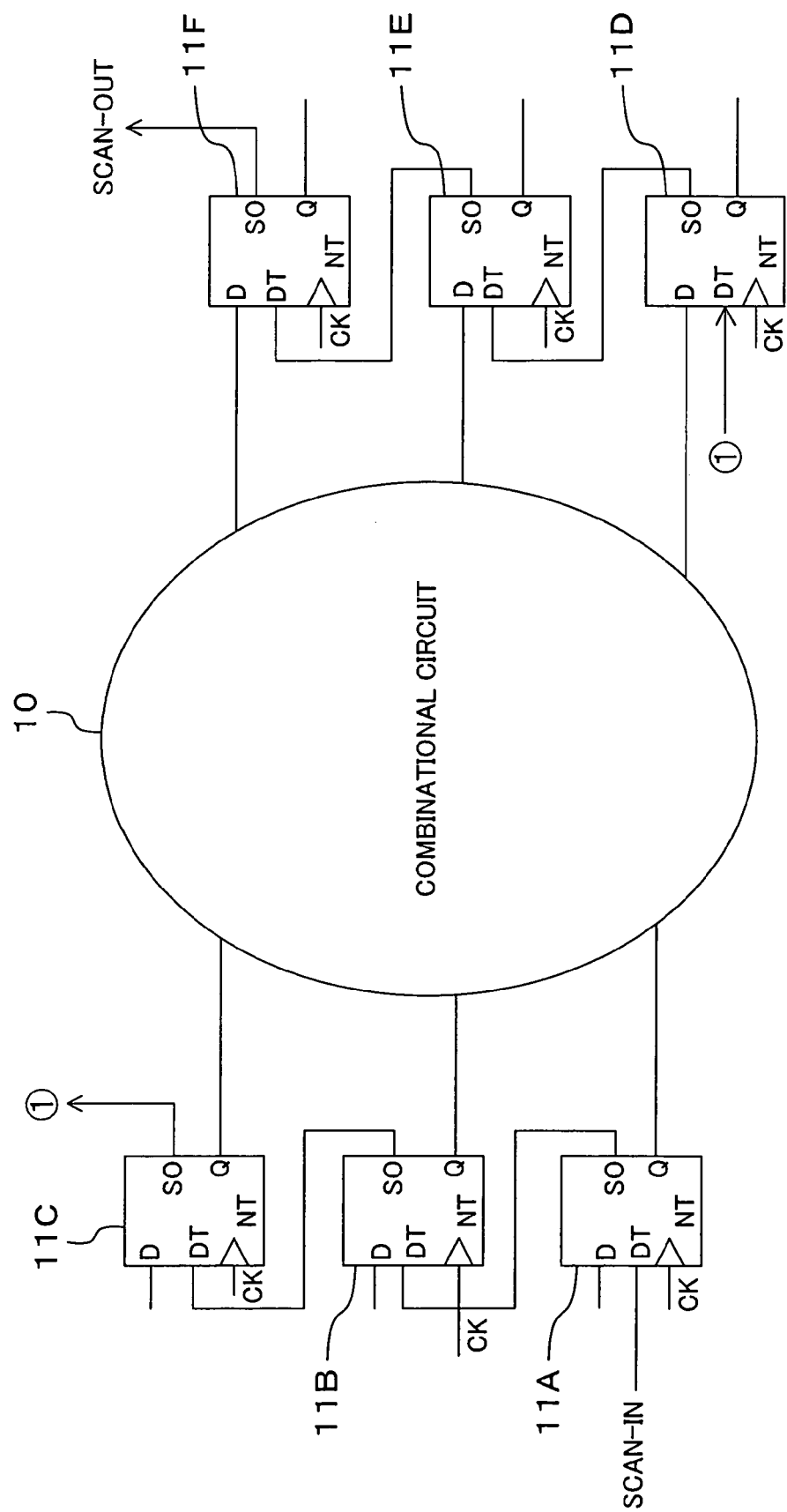
FIG. 29 illustrates the configuration of a conventional semiconductor integrated circuit.
Figure 30:
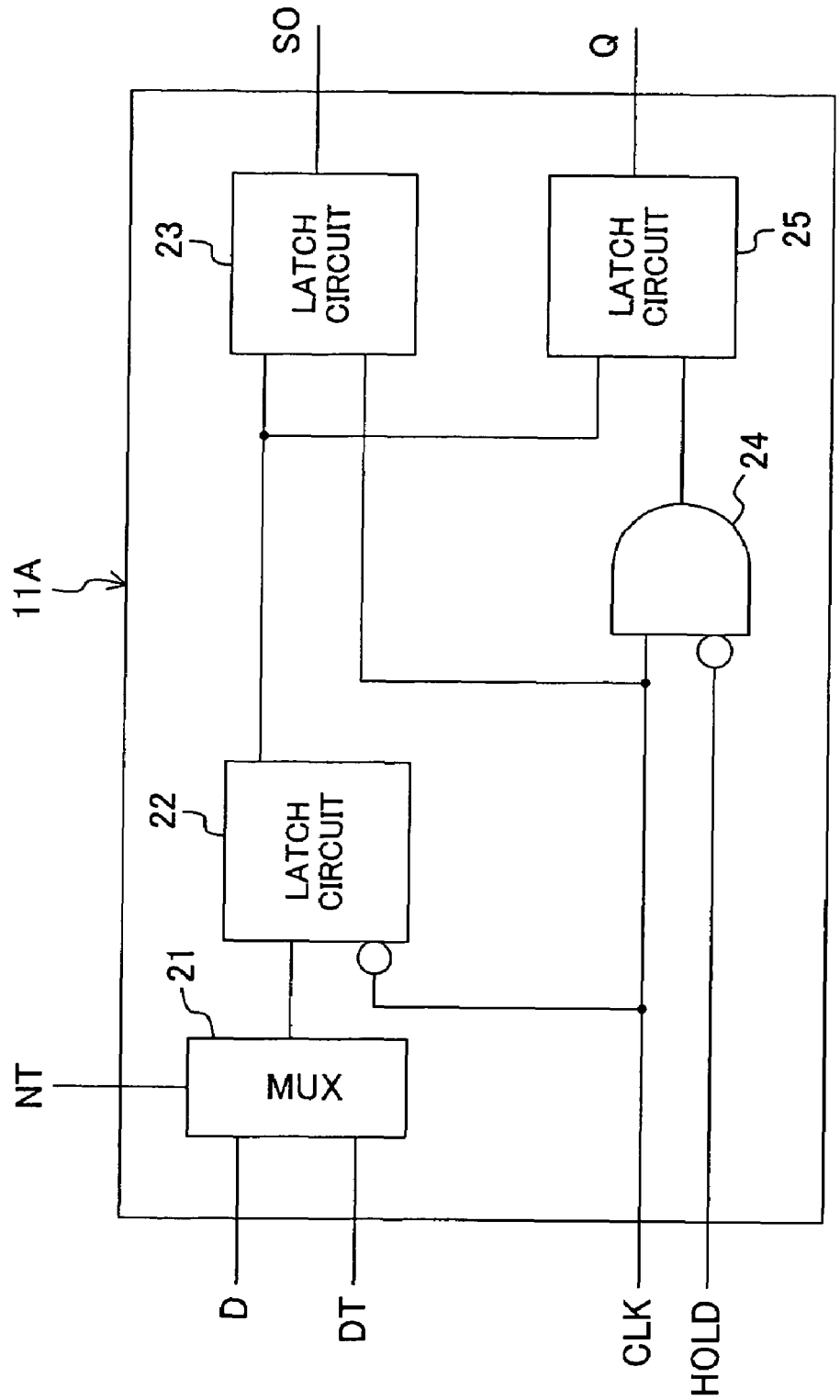
FIG. 30 illustrates an exemplary configuration of a flip flop circuit in the conventional semiconductor integrated circuit.
Figure 31:
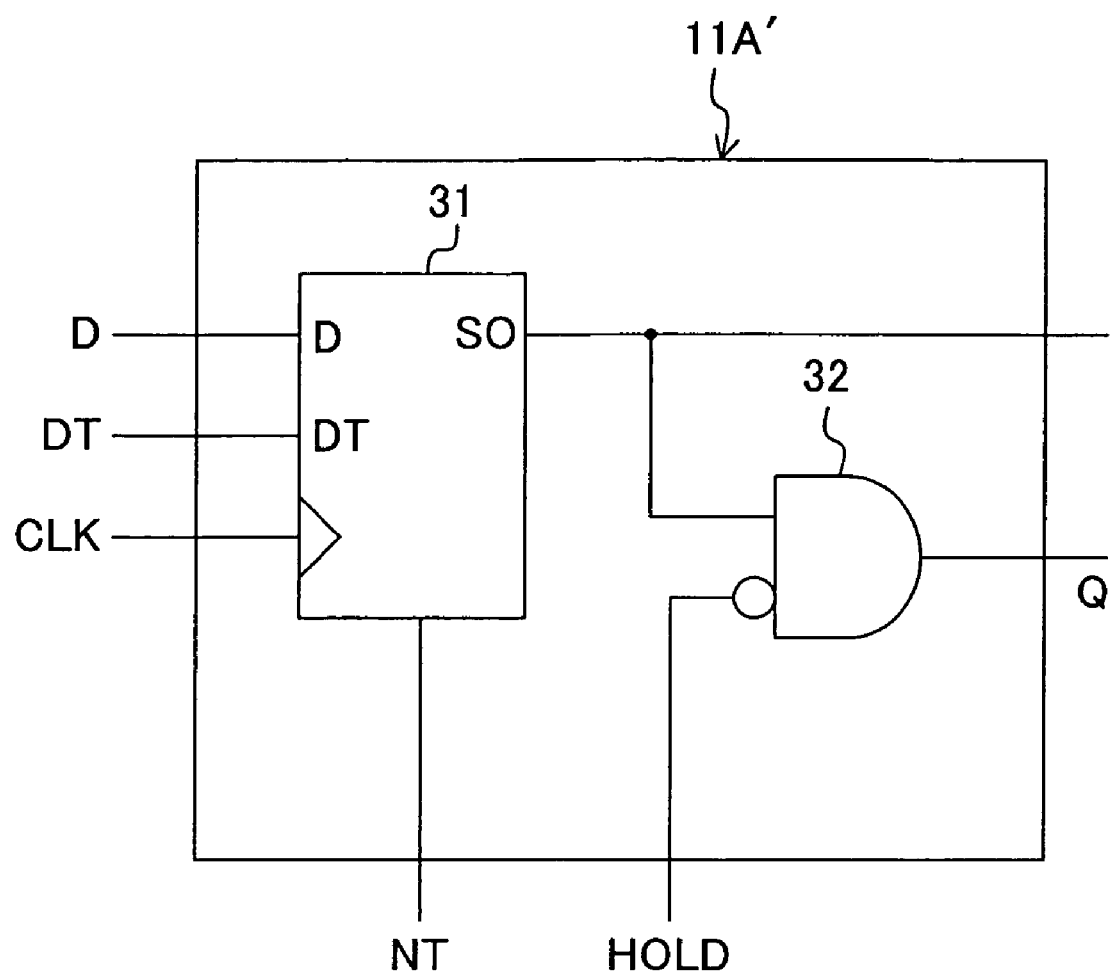
FIG. 31 illustrates another exemplary configuration of the flip flop circuit in the conventional semiconductor integrated circuit.

FIG. 28 illustrates the semiconductor integrated circuit of the fourth embodiment. In FIG. 28, the reference numeral 901 denotes a combinational circuit. The reference numerals 902a to 902f each indicate the flip flop circuit shown in FIG. 27. Outputs of the combinational circuit 901 are connected to the terminals D of the flip flop circuits 902a to 902f. The reference numeral 903 refers to power source wiring for supplying power supply voltage VDD, while the reference numeral 904 represents a transistor switch for cutting off the supply of the power supply voltage to the combinational circuit 901. When a logical value of 1 is applied to a gate signal SW, the transistor 904 turns on, and when a logical value of 0 is applied to the gate signal SW, the transistor switch 904 turns off. The power supply voltage VDD is supplied to the transistor 904 while the transistor 904 is on, and the power supply to the transistor 904 is cut off while the transistor 904 is off.

The gate signal SW is input into the terminals SW of the flip flop circuits 902a to 902f. When a logical value of 0 is applied to the gate signal SW, the potential of the terminals D of the flip flop circuits 902a to 902f is pulled down to ground potential VSS. When a logical value of 1 is applied to the gate signal SW, the pulling down is cancelled.

In the above-described configuration, even if an intermediate potential is generated within the combinational circuit 901 while the supply of the power supply voltage VDD to the combinational circuit 901 is cut off, it is possible to prevent the input terminals D of the flip flop circuits 902a to 902f from being at the intermediate potential, thereby preventing excessive leakage current in, and damage to, the combinational circuit.

What is claimed is:

1. A semiconductor integrated circuit comprising:
   a combinational circuit connected with a plurality of flip flop circuits;
   the plurality of flip flop circuits for capturing a plurality of output signals from the combinational circuit and for forming at least a scan chain;
   flip-flop-circuit power source wiring for supplying first power supply voltage to the plurality of flip flop circuits; and
   combinational-circuit power source wiring for supplying second power supply voltage to the combinational circuit,
   wherein the flip-flop-circuit power source wiring and the combinational-circuit power source wiring are electrically separate from each other at least during scan testing and provide the first power supply voltage to the plurality of flip flop circuits and the second power supply voltage to the combinational circuit, respectively.

2. A semiconductor integrated circuit comprising:
   a combinational circuit connected with a plurality of flip flop circuits;
   the plurality of flip flop circuits for capturing a plurality of output signals from the combinational circuit and for forming at least a scan chain;
   power source wiring for supplying power supply voltage to the plurality of flip flop circuits and the combinational circuit; and
   a variable power supply circuit for varying the power supply voltage to the power source wiring;
   wherein the variable power supply circuit supplies lower voltage to the combinational circuit during shift operation for scan testing than during capture operation.

3. The circuit of claim 1, further comprising a variable power supply circuit for varying the first power supply voltage to the flip-flop-circuit power source wiring and the second power supply voltage to the combinational-circuit power source wiring.

4. The circuit of claim 1, wherein during capture operation in which the output signals from the combinational circuit are captured into the plurality of flip flop circuits, the second power supply voltage to the combinational-circuit power source wiring is set to a given voltage, and
   during shift operation for scan test signals provided in scan testing, in which the plurality of flip flop circuits are serially connected one after another, the second power supply voltage to the combinational-circuit power source wiring is set to a voltage lower than the given voltage.

5. The circuit of claim 1, wherein during capture operation in which the output signals from the combinational circuit are captured into the plurality of flip flop circuits, the first power supply voltage to the flip-flop-circuit power source wiring is set to a given voltage, and
   during shift operation for scan test signals provided in scan testing, in which the plurality of flip flop circuits are serially connected one after another, the first power supply voltage to the flip-flop-circuit power source wiring is set to a voltage higher than the given voltage.

6. The circuit of claim 1 or 2, further comprising a built-in self-test device for performing a self-test of the combinational circuit.

7. The circuit of claim 2, further comprising:
   a measuring circuit for measuring a period of restoring time required for variation in the power supply voltage supplied from the power source wiring to be restored to a steady state, and
   a stop control circuit for stopping supply of a clock signal to the plurality of flip flop circuits during the period of restoring time.

8. The circuit of claim 1, further comprising:
   a first region, in which a plurality of flip-flop-circuit standard cells are provided;
   a second region, in which a plurality of combinational-circuit standard cells are provided;
   the flip-flop-circuit power source wiring for supplying power to the plurality of flip-flop-circuit standard cells that form the first region; and
   the combinational-circuit power source wiring for supplying power to the plurality of combinational-circuit standard cells that form the second region.

9. The circuit of claim 8, wherein the plurality of flip-flop-circuit standard cells are arranged in rows and the plurality of combinational-circuit standard cells are arranged in rows, the rows of the plurality of flip-flop-circuit standard cells and the rows of the plurality of combinational-circuit standard cells extending in the same direction; and
   the rows of the plurality of flip-flop-circuit standard cells and the rows of the plurality of combinational-circuit standard cells are arranged alternately.

10. The circuit of claim 2, further comprising
    a combinational-circuit standard cell which includes a power source cut-off circuit.

11. The circuit of claim 1, further comprising a plurality of standard cells, each of which includes therein:
    a first power source wiring for supplying power to the plurality of flip flop circuits; and
    a second power source wiring for supplying power to the combinational circuit,
    wherein the power supply from the flip-flop-circuit power source wiring to the first power source wiring in each of the plurality of standard cells, and the power supply from the combinational-circuit power source wiring to the second power source wiring in each of the plurality of standard cells are performed independently of each other.

12. A semiconductor integrated circuit testing method for testing the semiconductor integrated circuit of claim 1, the method comprising:
    the first step of lowering the second power supply voltage to the combinational circuit;
    the second step of setting scan test data in the plurality of flip flop circuits, after the first step has been performed;
    the third step of raising the second power supply voltage to the combinational circuit, after the second step has been performed; and
    the fourth step of operating the combinational circuit, after the third step has been performed.

13. The method of claim 12, wherein in the first step, the second power supply voltage to the combinational circuit is cut off.

14. A semiconductor integrated circuit testing method for testing the semiconductor integrated circuit of claim 7, the method comprising:

the first step of lowering the power supply voltage to the combinational circuit;

the second step of setting scan test data in the plurality of flip flop circuits, after the first step has been performed;

the third step of raising the power supply voltage to the combinational circuit, after the second step has been performed;

the fourth step of stopping supply of a clock signal to the plurality of flip flop circuits for a certain period of time, after the third step has been performed; and the fifth step of operating the combinational circuit, after the fourth step has been performed.

15. A semiconductor integrated circuit testing method for testing the semiconductor integrated circuit of claim 3, the method comprising:

the first step of lowering the second power supply voltage to the combinational circuit;

the second step of setting scan test data in the plurality of flip flop circuits, after the first step has been performed;

the third step of raising the second power supply voltage to the combinational circuit, after the second step has been performed;

the fourth step of stopping supply of a clock signal to the plurality of flip flop circuits for a certain period of time, after the third step has been performed; and the fifth step of operating the combinational circuit, after the fourth step has been performed.

16. A semiconductor integrated circuit testing method for testing the semiconductor integrated circuit of claim 1, the method comprising:

the first step of raising the first power supply voltage to the plurality of flip flop circuits;

the second step of setting scan test data in the plurality of flip flop circuits, after the first step has been performed;

the third step of lowering the first power supply voltage to the plurality of flip flop circuits, after the second step has been performed; and the fourth step of operating the combinational circuit, after the third step has been performed.

17. A semiconductor integrated circuit testing method for testing the semiconductor integrated circuit of claim 7, the method comprising:

the first step of raising the power supply voltage to the plurality of flip flop circuits;

the second step of setting scan test data in the plurality of flip flop circuits, after the first step has been performed;

the third step of lowering the power supply voltage to the plurality of flip flop circuits, after the second step has been performed;

the fourth step of stopping supply of a clock signal to the plurality of flip flop circuits for a certain period of time, after the third step has been performed; and the fifth step of operating the combinational circuit, after the fourth step has been performed.

18. A semiconductor integrated circuit comprising;

a combinational circuit connected with a plurality of flip flop circuits;

the plurality of flip flop circuits for capturing a plurality of output signals from the combinational circuit and for forming at least a scan chain;

a flip-flop-circuit power source wiring for supplying first power supply voltage to the plurality of flip flop circuits; and a combinational-circuit power source wiring for supplying second power supply voltage to the combinational circuit, wherein the flip-flop-circuit power source wiring and the combinational-circuit power source wiring are electrically separate from each other and provide the first power supply voltage to the plurality of flip flop circuits and the second power supply voltage to the combinational circuit, respectively, and the first power supply voltage to the plurality of flip flop circuits and the second power supply voltage to the combinational circuit are independently adjustable.

19. The circuit of claim 18, further comprising a variable power supply circuit for varying the first power supply voltage to the flip-flop-circuit power source wiring and the second power supply voltage to the combinational-circuit power source wiring.

20. The circuit of claim 18, wherein during capture operation in which the output signals from the combinational circuit are captured into the plurality of flip flop circuits, the second power supply voltage to the combinational-circuit power source wiring is set to a given voltage, and during shift operation for scan test signals provided in scan testing, in which the plurality of flip flop circuits are serially connected one after another, the second power supply voltage to the combinational-circuit power source wiring is set to a voltage lower than the given voltage.

21. The circuit of claim 18, wherein during capture operation in which the output signals from the combinational circuit are captured into the plurality of flip flop circuits, the first power supply voltage to the flip-flop-circuit power source wiring is set to a given voltage, and during shift operation for scan test signals provided in scan testing, in which the plurality of flip flop circuits are serially connected one after another, the first power supply voltage to the flip-flop-circuit power wiring is set to a voltage higher than the given voltage.

22. The circuit of claim 18, further comprising a built-in self-test device for performing a self-test of the combinational circuit.

23. The circuit of claim 18, further comprising:

a measuring circuit for measuring a period of restoring time required for variation in the first power supply voltage supplied to the flip-flop-circuit power source wiring and the second power supply voltage supplied to the combinational-circuit power source wiring to be restored to a steady stage, and a stop control circuit for stopping supply of a clock signal to the plurality of flip flop circuits during the period of restoring time.

* * * * *

UNITED STATES PATENT AND TRADEMARK OFFICE
CERTIFICATE OF CORRECTION

PATENT NO. : 7,610,533 B2  Page 1 of 1
APPLICATION NO. : 11/266406
DATED : October 27, 2009
INVENTOR(S) : Takashi Ishimura et al.

It is certified that error appears in the above-identified patent and that said Letters Patent is hereby corrected as shown below:

In Item (56) "References Cited", under "U.S. Patent Documents",
please change the reference "2006/1023231" to "2006/0232316".

In Item (56) "References Cited", under "Foreign Patent Documents",
please change the reference "WO 20051008777 A1" to "WO 2005/008777 A1".

Signed and Sealed this

Eleventh Day of May, 2010

David J. Kappos
*Director of the United States Patent and Trademark Office*

UNITED STATES PATENT AND TRADEMARK OFFICE
CERTIFICATE OF CORRECTION

PATENT NO. : 7,610,533 B2  Page 1 of 1
APPLICATION NO. : 11/266406
DATED : October 27, 2009
INVENTOR(S) : Takashi Ishimura It is certified that error appears in the above-identified patent and that said Letters Patent is hereby corrected as shown below:

Title page, item (*) Notice:   should read as follows:   Subject to any disclaimer, the term of this patent is extended or adjusted under 35 U.S.C. 154(b) by 278 days.

Signed and Sealed this

Twentieth Day of July, 2010

David J. Kappos
*Director of the United States Patent and Trademark Office*